United States Patent
Lee et al.

(10) Patent No.: US 11,694,996 B2
(45) Date of Patent: Jul. 4, 2023

(54) SEMICONDUCTOR PACKAGE INCLUDING A PAD CONTACTING A VIA

(71) Applicant: Samsung Electronics Co., Ltd., Suwon-si (KR)

(72) Inventors: Hyuekjae Lee, Hwaseong-si (KR); Un-Byoung Kang, Hwaseong-Si (KR); Sang Cheon Park, Hwaseong-si (KR); Jinkyeong Seol, Cheonan-si (KR); Sanghoon Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/245,913

(22) Filed: Apr. 30, 2021

(65) Prior Publication Data
US 2022/0028834 A1    Jan. 27, 2022

(30) Foreign Application Priority Data
Jul. 23, 2020  (KR) .................. 10-2020-0091844

(51) Int. Cl.
| H01L 25/065 | (2023.01) |
| H01L 23/48 | (2006.01) |
| H01L 23/00 | (2006.01) |
| H01L 25/00 | (2006.01) |

(52) U.S. Cl.
CPC ........ *H01L 25/0657* (2013.01); *H01L 23/481* (2013.01); *H01L 24/13* (2013.01); *H01L 24/20* (2013.01); *H01L 24/97* (2013.01); *H01L 25/50* (2013.01); *H01L 2224/1302* (2013.01); *H01L 2224/214* (2013.01); *H01L 2225/06541* (2013.01)

(58) Field of Classification Search
CPC ............... H01L 25/0657; H01L 23/481; H01L 2225/06541; H01L 21/76898
See application file for complete search history.

(56) References Cited

U.S. PATENT DOCUMENTS

| 8,501,587 | B2 | 8/2013 | Chen et al. |
| 9,030,009 | B2 | 5/2015 | Moon et al. |
| 9,128,123 | B2 | 9/2015 | Liu et al. |
| 10,163,864 | B1 * | 12/2018 | England ............ H01L 21/76898 |
| 10,290,571 | B2 | 5/2019 | Yu et al. |

(Continued)

FOREIGN PATENT DOCUMENTS

KR    10-2012-0126370 A    11/2012

*Primary Examiner* — Mamadou L Diallo
(74) *Attorney, Agent, or Firm* — Muir Patent Law, PLLC

(57) ABSTRACT

A semiconductor package is provided. The semiconductor package may include a first semiconductor die, a second semiconductor die stacked on the first semiconductor die, the second semiconductor die having a width smaller than a width of the first semiconductor die, a third semiconductor die stacked on the second semiconductor die, the third semiconductor die having a width smaller than the width of the first semiconductor die, and a mold layer covering side surfaces of the second and third semiconductor dies and a top surface of the first semiconductor die. The second semiconductor die may include a second through via, and the third semiconductor die may include a third conductive pad in contact with the second through via.

17 Claims, 20 Drawing Sheets

(56) References Cited

U.S. PATENT DOCUMENTS

| | | | |
|---|---|---|---|
| 2013/0032947 A1* | 2/2013 | Park | H01L 21/568 257/777 |
| 2013/0264706 A1* | 10/2013 | Lee | H01L 21/568 257/737 |
| 2014/0084456 A1* | 3/2014 | Kang | H01L 25/50 257/737 |
| 2018/0006006 A1* | 1/2018 | Kim | H01L 24/33 |
| 2018/0122774 A1* | 5/2018 | Huang | H01L 24/73 |
| 2020/0075490 A1* | 3/2020 | Sung | H01L 24/73 |
| 2020/0105635 A1 | 4/2020 | Yu et al. | |
| 2020/0294965 A1* | 9/2020 | Hsu | H01L 24/08 |
| 2020/0395295 A1* | 12/2020 | Tsai | H01L 23/53228 |
| 2020/0402960 A1* | 12/2020 | Chen | H01L 23/3121 |
| 2021/0050328 A1* | 2/2021 | Lee | H01L 25/0652 |
| 2021/0090993 A1* | 3/2021 | Yu | H01L 24/19 |
| 2021/0098381 A1* | 4/2021 | Yu | H01L 25/0652 |
| 2021/0159182 A1* | 5/2021 | Jeng | H01L 24/14 |
| 2021/0193547 A1* | 6/2021 | Wan | H01L 25/50 |

\* cited by examiner

SEMICONDUCTOR PACKAGE INCLUDING A PAD CONTACTING A VIA

CROSS-REFERENCE TO RELATED APPLICATIONS

This U.S. non-provisional patent application claims priority under 35 U.S.C. § 119 to Korean Patent Application No. 10-2020-0091844, filed on Jul. 23, 2020, in the Korean Intellectual Property Office, the entire contents of which are hereby incorporated by reference.

BACKGROUND OF THE INVENTION

The present disclosure relates to a semiconductor package.

A semiconductor package is configured to easily use an integrated circuit chip as a part of an electronic product. Conventionally, the semiconductor package includes a printed circuit board (PCB) and a semiconductor chip die, which is mounted on the PCB and is electrically connected to the PCB using bonding wires or bumps. With development of the electronic industry, many studies are being conducted to improve reliability and durability of semiconductor packages.

SUMMARY

An embodiment of the inventive concept provides a semiconductor package with improved reliability.

According to an embodiment of the inventive concept, a semiconductor package includes a first semiconductor die, a second semiconductor die stacked on the first semiconductor die, the second semiconductor die having a width smaller than a width of the first semiconductor die, a third semiconductor die stacked on the second semiconductor die, the third semiconductor die having a width smaller than the width of the first semiconductor die, and a mold layer covering side surfaces of the second and third semiconductor dies and a top surface of the first semiconductor die. The second semiconductor die may include a first through via, and the third semiconductor die may include a first conductive pad contacting the first through via.

According to an embodiment of the inventive concept, a semiconductor package includes a first sub-semiconductor package and a second sub-semiconductor package, which are sequentially stacked. The first sub-semiconductor package may include a first redistribution structure, a first semiconductor die connected to the first redistribution structure, a first mold layer covering a side surface of the first semiconductor die and a top surface of the first redistribution structure, and a first mold via penetrating the first mold layer. The second sub-semiconductor package may include a second redistribution structure, a second semiconductor die connected to the second redistribution structure, and a second mold layer covering a side surface of the second semiconductor die and a top surface of the second redistribution structure. The second redistribution structure may include a first redistribution pad contacting the first mold via.

According to an embodiment of the inventive concept, a semiconductor package includes a first semiconductor die, a plurality of second semiconductor dies stacked on the first semiconductor die, and a mold layer covering side surfaces of the second semiconductor dies and a top surface of the first semiconductor die. Each of the second semiconductor dies has a width smaller than a width of the first semiconductor die. The first semiconductor die may include a first substrate, a first interlayer insulating layer disposed on a front surface of the first substrate, a first interconnection line disposed in the first interlayer insulating layer, a first protection layer covering a rear surface of the first substrate, and a first through via penetrating the first protection layer and the first substrate. Each of the second semiconductor dies may include a second substrate, a second interlayer insulating layer disposed on a front surface of the second substrate, a second passivation layer covering the second interlayer insulating layer, a second conductive pad disposed in the second passivation layer, a second interconnection line disposed in the second interlayer insulating layer, a second protection layer covering a rear surface of the second substrate, and a second through via penetrating the second protection layer and the second substrate. The first through via may contact the second conductive pad of a lowermost one of the second semiconductor dies, and the second through via of the lowermost one of the second semiconductor dies may have an aspect ratio of 5 or greater.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Example embodiments of the inventive concepts will now be described more fully with reference to the accompanying drawings, in which example embodiments are shown.

Figure 1:
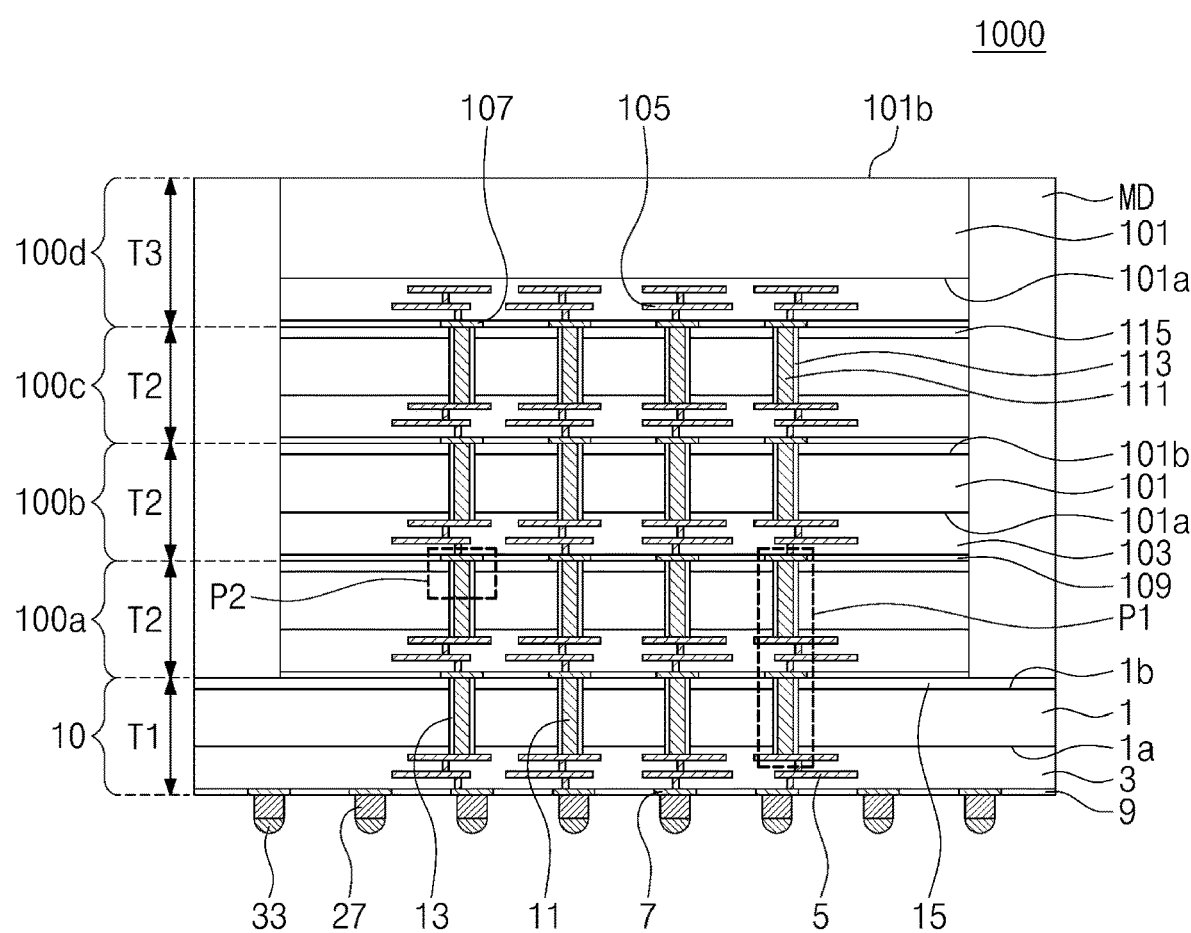
FIG. 1 is a sectional view illustrating a semiconductor package according to an embodiment of the inventive concept.

FIG. 1 is a sectional view illustrating a semiconductor package according to an embodiment of the inventive concept.

Referring to FIG. 1, a semiconductor package 1000 according to the present embodiments may include second to fifth semiconductor dies 100a, 100b, 100c, and 100d, which are sequentially stacked on a first semiconductor die 10. The first semiconductor die 10 may be a chip that is of a kind different from the second to fifth semiconductor dies 100a, 100b, 100c, and 100d. The first semiconductor die 10 may be, for example, a logic circuit chip that primarily performs logic functions using one or more logic integrated circuits. The second to fifth semiconductor dies 100a, 100b, 100c, and 100d may be memory chips of the same kind, which memory chips primarily store data and include an integrated circuit comprising a memory array formed there. The memory chip may be, for example, one of DRAM, NAND Flash memory, SRAM, MRAM, PRAM, and RRAM chips. FIG. 1 illustrates a structure, in which one logic circuit chip and four memory chips are stacked, but the stacking numbers of the logic circuit chip and the memory chips are not limited to this example and can be variously changed. A width (e.g., horizontal width) of the first semiconductor die 10 may be larger than those of the second to fifth semiconductor dies 100a, 100b, 100c, and 100d. The semiconductor package 1000 may be a high bandwidth memory (HBM) chip.

A mold layer MD may cover a top surface of the first semiconductor die 10 and side surfaces of the second to fifth semiconductor dies 100a, 100b, 100c, and 100d. The mold layer MD may be formed of or include, for example, an insulating resin (e.g., epoxy molding compound (EMC)) or other insulating material, or a combination of different insulating resins or other insulating materials. The mold layer MD may further include a filler, which is dispersed in the insulating resin. The filler may be formed of or include, for example, silicon oxide ($SiO_2$). A top surface of the mold layer MD may be coplanar with a second substrate rear surface 101b of the fifth semiconductor die 100d. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first semiconductor die 10 may include a first substrate 1. The first substrate 1 may be a semiconductor substrate and may include a first substrate front surface 1a and a first substrate rear surface 1b, which are opposite to each other. The first substrate front surface 1a (and front surfaces of other of the semiconductor dies 100a-100d) may be active surfaces, adjacent to which an integrated circuit, for example including active devices, is formed. The first substrate rear surface 1b (and rear surfaces of other of the semiconductor dies 100a-100d) may not have any integrated circuits formed adjacent thereto. A first interlayer insulating layer 3 may be disposed on the first substrate front surface 1a. First transistors (not shown) and first lines 5 of a multi-layered structure may be disposed in the first interlayer insulating layer 3. First conductive pads 7 may be disposed on the first interlayer insulating layer 3. First conductive pillars 27 may be bonded to the first conductive pads 7, respectively. A solder layer 33 may be bonded to a bottom surface of each of the first conductive pillars 27. The first interlayer insulating layer 3 may be covered with a first passivation layer 9, for example, formed of an insulating material. The first substrate rear surface 1b may be covered with a first protection layer 15, for example, formed of an insulating material. A first through via 11 may be provided to penetrate the first protection layer 15, the first substrate 1, and a portion of the first interlayer insulating layer 3. A first penetration insulating layer 13 may be interposed between the first through via 11 and the first substrate 1. The various through vias described herein as passing through a semiconductor die are also described as through-substrate vias, or through-silicon vias.

Each of the second to fifth semiconductor dies 100a, 100b, 100c, and 100d may include a second substrate 101. The second substrate 101 may be a semiconductor substrate and may include a second substrate front surface 101a and the second substrate rear surface 101b, which are opposite to each other. A second interlayer insulating layer 103 may be disposed on the second substrate front surface 101a. Second transistors (not shown) and second lines 105 of a multi-layered structure may be disposed in the second interlayer insulating layer 103. Second conductive pads 107 may be disposed on the second interlayer insulating layer 103. The second interlayer insulating layer 103 may be covered with a second passivation layer 109. The second substrate rear surface 101b may be covered with a second protection layer 115. In each of the second to fourth semiconductor dies 100a, 100b, and 100c, a second through via 111 (e.g., conductive via) may be provided to penetrate the second protection layer 115, the second substrate 101, and a portion of the second interlayer insulating layer 103. A second penetration insulating layer 113 may be interposed between the second through via 111 and the second substrate 101.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The fifth semiconductor die 100d may not include the second through via 111 and the second penetration insulating layer 113. Each of the first to fifth semiconductor dies 10, 100a, 100b, 100c, and 100d may contact one or two adjacent of the first to fifth semiconductor dies 10, 100a, 100b, 100c, and 100d. For example, the first protection layer 15 of the first semiconductor die 10 may contact the second passivation layer 109 of the second semiconductor die 100a. The second protection layer 115 of the second semiconductor die 100a may contact the second passivation layer 109 of the third semiconductor die 100b, etc. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the first and second substrates 1 and 101 may be a semiconductor substrate, a silicon single crystalline substrate, or a silicon-on-insulator (SOI) substrate. The first substrate 1 and second substrates 101 may all be the same type of substrate, or some of the first substrate 1 and second substrates 101 may be different types of substrates (e.g., some may be semiconductor substrates, while others may be silicon-on-insulator (SOI) substrates). Each of the first and second substrates 1 and 101 may be referred to using the term 'semiconductor substrate' or 'die substrate' so as to distinguish it from package substrates SB1 and SB2, which will be described with reference to FIG. 7. The first and second interlayer insulating layers 3 and 103 may be formed of or include at least one of silicon oxide, silicon nitride, silicon oxynitride, or porous insulating materials and may have a single- or multi-layered structure. Each of the first and second protection layers 15 and 115 may be formed of or include, for example, silicon oxide. Each of the first and second penetration insulating layers 13 and 113 may be formed of or include, for example, an insulating material such as silicon oxide. Each of the first and second conductive pads 7 and 107 may be formed of or include at least one of metallic materials (e.g., copper, aluminum, cobalt, nickel, and gold). The first and second conductive pads 7 and 107, and other pads described herein, may be formed to have a substantially flat top and bottom surface, one of which may be coplanar with a surface of its respective semiconductor die or may be recessed from the surface of its respective semiconductor die, and may transfer voltage and signals to and from its respective semiconductor die. The first conductive pillars 27 may be formed of or include at least one of, for example, copper, cobalt, or nickel, and may have a pillar shape (e.g., with flat top and bottom surfaces). Each of the first and second passivation layers 9 and 109 may be formed of or include at least one of, for example, silicon oxide, silicon nitride, or photo imagable dielectric (PID) resin. Each of the first and second interlayer insulating layers 3 and 103 may be composed of multiple interlayer insulating layers, and each of the first and second passivation layers 9 and 109 may correspond to the topmost layer of the multiple interlayer insulating layers.

The solder layer 33 may be formed of or include, for example, Sn or SnAg, for example, in the shape of a solder bump or solder ball. The first and second through vias 11 and 111 may be formed of or include, for example, copper.

In the present embodiment, the first semiconductor die 10 may have a first thickness T1. Each of the second to fourth semiconductor dies 100a, 100b, and 100c may have a second thickness T2. The fifth semiconductor die 100d may have a third thickness T3. In an embodiment, the first thickness T1 may be equal to or larger than the second thickness T2. The third thickness T3 may be larger than the second thickness T2. The third thickness T3 may be equal to, larger, or smaller than the first thickness T1.

Figure 2:
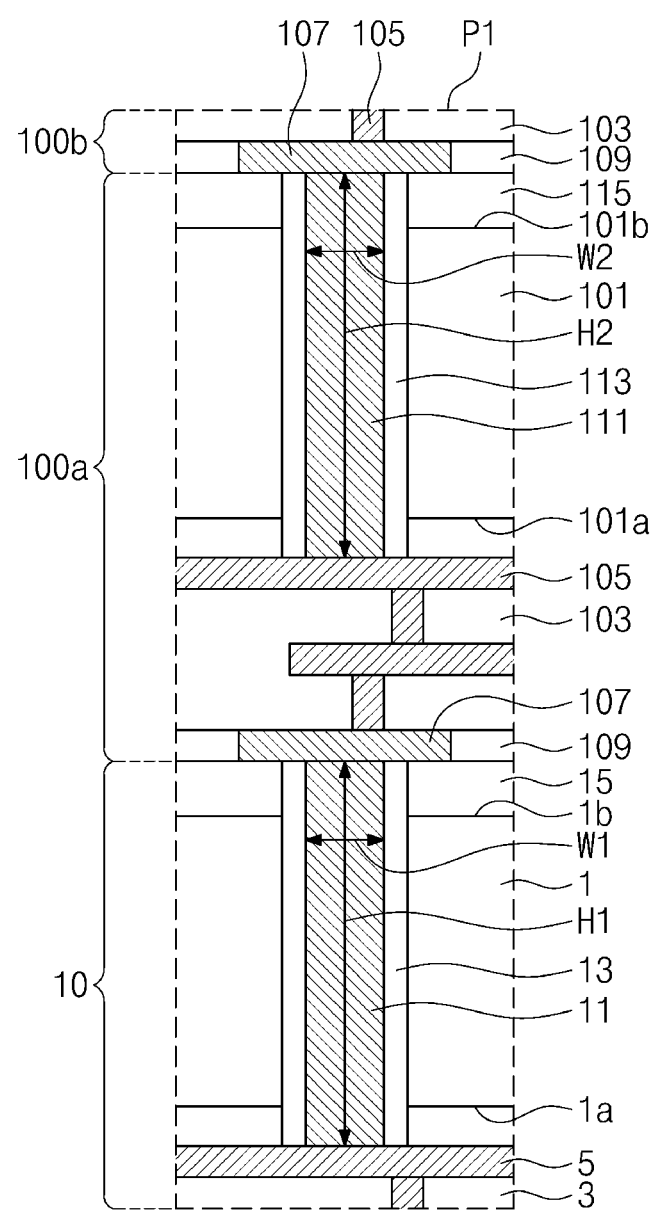
FIG. 2 is an enlarged sectional view of a portion 'P1' of FIG. 1.

FIG. 2 is an enlarged sectional view of a portion 'P1' of FIG. 1.

Referring to FIG. 2, the first through via 11 of the first semiconductor die 10 may contact the second conductive pad 107 of the second semiconductor die 100a. The first through via 11 may contact one of the first lines 5. For example, the first through via 11 may contact the first line 5, which is closest to the first substrate front surface 1a, among the first lines 5 located in an M1 layer. The first through via 11 may electrically connect one of the first lines 5 to the second conductive pad 107 of the second semiconductor die 100a. The first through via 11 may have a first width W1 (e.g., in a horizontal direction) and a first height H1 (e.g., in a vertical direction). In an embodiment, a first aspect ratio, which is given by dividing the first height H1 by the first width W1, may be equal to or greater than 5. In one embodiment, the first aspect ratio has a value between about 5 and about 20. As shown in FIG. 2, a top surface of the first through via 11 may be coplanar with a top surface of the first protection layer 15. Alternatively, the top surface of the first through via 11 may have a rounded shape or may protrude outward from the first protection layer 15 and/or the first semiconductor die 10.

The second through via 111 of the second semiconductor die 100a may contact the second conductive pad 107 of the third semiconductor die 100b. The second through via 111 may contact one of the second lines 105. For example, the second through via 111 may contact the second line 105, which is closest to the second substrate front surface 101a, among the second lines 105 located in the M1 layer. The second through via 111 may connect one of the second lines 105 electrically to the second conductive pad 107 of the third semiconductor die 100b. The second through via 111 may have a second width W2 and a second height H2. In an embodiment, a second aspect ratio, which is given by dividing the second height H2 by the second width W2, may be equal to or greater than 5. In one embodiment, the first aspect ratio has a value between about 5 and about 20. As shown in FIG. 2, a top surface of the second through via 111 may be coplanar with a top surface of the second protection layer 115. Alternatively, the top surface of the second through via 111 may have a rounded shape or may protrude outward from the second protection layer 115 and/or the second semiconductor die 100a. The first width W1 may be equal or similar to the second width W2. The first height H1 may be equal or similar to the second height H2.

The first penetration insulating layer 13 may extend and may be interposed between the first through via 11 and the first protection layer 15 and between the first through via 11 and the first interlayer insulating layer 3. The second penetration insulating layer 113 may extend such that it is interposed between the second through via 111 and the second protection layer 115 and between the second through via 111 and the second interlayer insulating layer 103.

Figure 3:
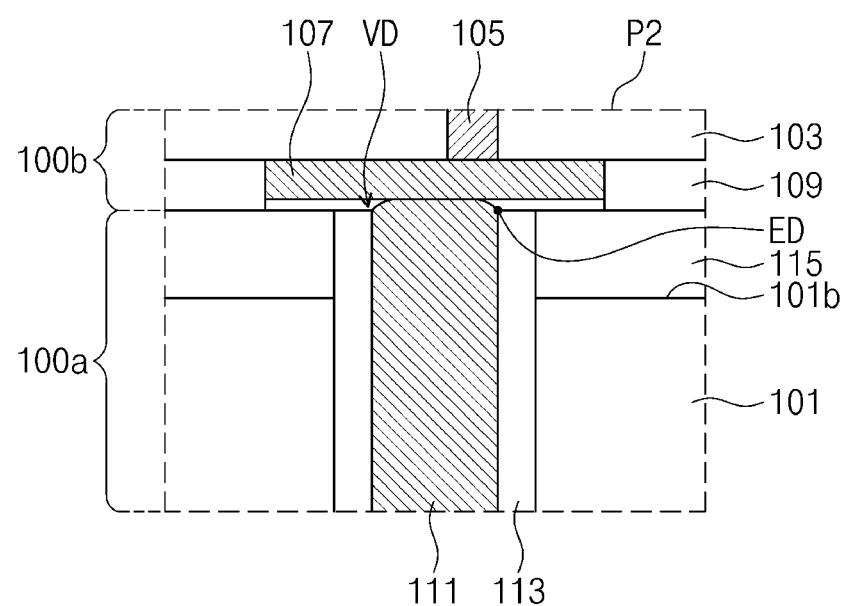
FIG. 3 is an enlarged sectional view of a portion 'P2' of FIG. 1.

FIG. 3 is an enlarged sectional view of a portion P2' of FIG. 1.

Referring to FIG. 3, a bottom surface of the second conductive pad 107 of the third semiconductor die 100b may be higher than a bottom surface of the second passivation layer 109 of the third semiconductor die 100b. Accordingly, in this embodiment, a bottom surface of the second conductive pad 107 is not coplanar with a bottom surface of the second passivation layer 109. Accordingly, the second passivation layer 109 of the third semiconductor die 100b may have a partially-exposed side surface. A portion of the second through via 111 may protrude outward from the second semiconductor die 100a. The top surface of the second through via 111 may have a rounded shape. A center portion of the second through via 111 may protrude outward from the second semiconductor die 100a and may contact the second conductive pad 107 of the third semiconductor die 100b. An edge ED of the second through via 111 may be spaced apart from the second conductive pad 107 of the third semiconductor die 100b. A void region VD may be provided between the edge ED of the second through via 111 and the second conductive pad 107 of the third semiconductor die 100b. The void region VD may extend into regions between the second conductive pad 107 of the third semiconductor die 100b and the second protection layer 115 of the second semiconductor die 100a and between the second conductive pad 107 of the third semiconductor die 100b and the second penetration insulating layer 113 of the second semiconductor die 100a. Accordingly, the bottom surface of the second conductive pad 107 of the third semiconductor die 100b, the top surface of the second protection layer 115 of the second semiconductor die 100a, and the top surface of the second penetration insulating layer 113 of the second semiconductor die 100a may be exposed to the void region VD. Although not illustrated, the shape of the first through via 11 may also be substantially the same as or similar to the second through via 111 of FIG. 3.

In the semiconductor package 1000 according to the present embodiment, the through vias 11 and 111 of a lower semiconductor die may contact the conductive pads 107 of an upper semiconductor die, without any conductive bump interposed therebetween, and this structure of the semiconductor package is advantageous for a fine-pitch process and for improving integration and heat-dissipation characteristics of the semiconductor package. Furthermore, it may be unnecessary to form a conductive bump between a lower semiconductor die and an upper semiconductor die, and the overall process may be simplified. In addition, in certain embodiments, since the aspect ratio of the through vias 11 and 111 is equal to or greater than 5, a die-handling operation of the semiconductor die may be easily performed during the fabrication process. For example, since the aspect ratio of the through vias 11 and 111 is equal to or greater than 5, the through vias 11 and 111 may be provided to have a relatively large volume, allowing for effective thermal expansion of the through vias 11 and 111 (particularly in a vertical direction) during the bonding process of the first to fifth semiconductor dies 10, 100a, 100b, 100c, and 100d, and thus, the through vias 11 and 111 may be effectively adhered to the conductive pads 107. Accordingly, it is possible to fabricate a semiconductor package with improved reliability.

FIGS. 4A to 4E are sectional views sequentially illustrating a process of fabricating a semiconductor package having the section of FIG. 1.

Figure 4A:
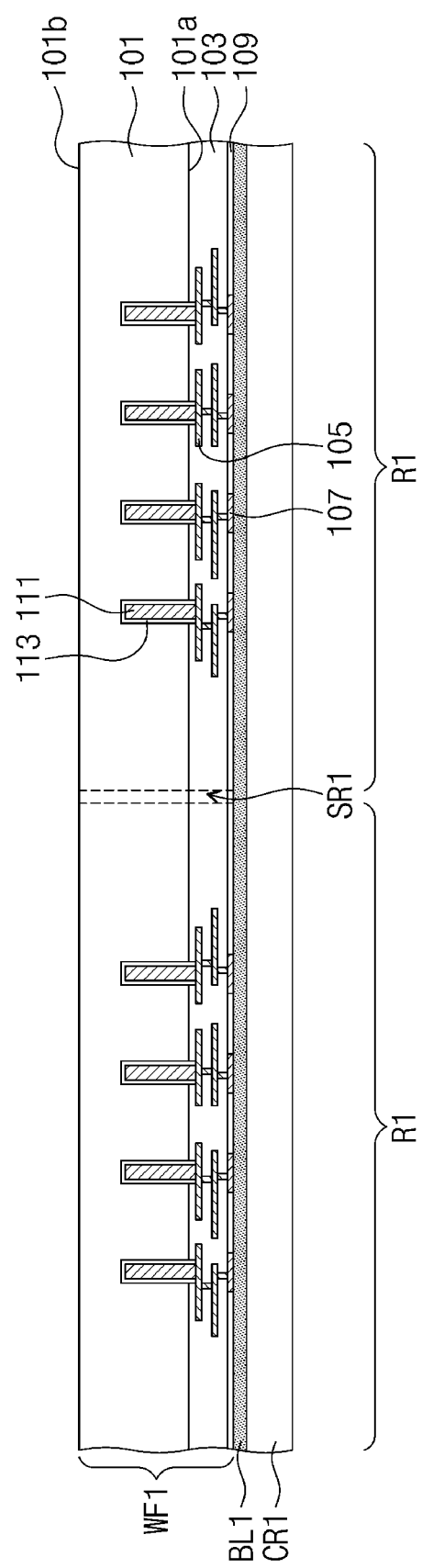
FIGS. 4A to 4E are sectional views sequentially illustrating a process of fabricating a semiconductor package having the section of FIG. 1.

Referring to FIG. 4A, a first wafer structure WF1 may be prepared. The first wafer structure WF1 has a plurality of first chip regions R1 and a first separation region SR1 therebetween. The first separation region SR1 may be a scribe lane region. The first wafer structure WF1 may include the second substrate 101. The second substrate 101 may include the second substrate front surface 101a and the second substrate rear surface 101b, which are opposite to each other. Initially, the second substrate 101 may be in a flipped orientation compared to FIG. 4a, so that the second substrate front surface 101a is above the second substrate rear surface 101b. Second transistors (not shown) and the second interlayer insulating layer 103 covering them may be formed on the second substrate front surface 101a. A portion of the second interlayer insulating layer 103 and the second substrate 101 may be etched to form a second penetration hole, and then, the second through via 111 and the second penetration insulating layer 113 are formed in the second penetration hole. The second lines 105, which are in contact with the second through vias 111, and the second interlayer insulating layer 103 are then formed. Subsequently, the second conductive pads 107 and the second passivation layer 109 are formed on the second interlayer insulating layer 103. The first wafer structure WF1 may then be inverted (e.g., flipped) so that the second passivation layer 109 faces downward (as shown in FIG. 4A), and then, the first wafer structure WF1 may be bonded to a first carrier substrate CR1 by a first adhesive layer BL1 interposed therebetween. The first adhesive layer BL1 may be formed of or include at least one of adhesive, thermosetting, thermoplastic, or photo-curable resins.

Figure 4B:
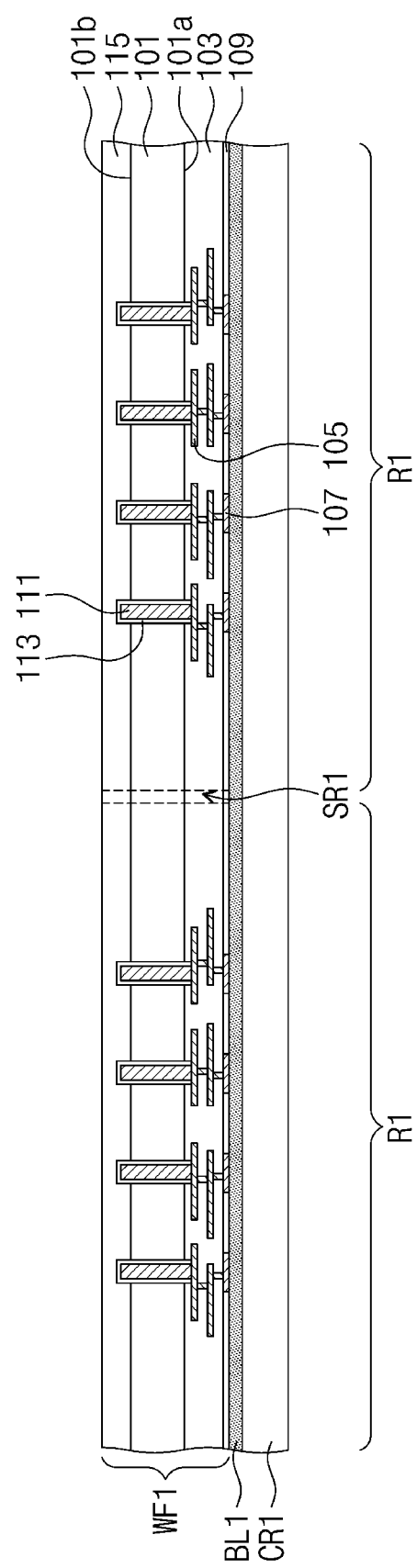

Referring to FIG. 4B, a grinding or etch-back process may be performed on the second substrate rear surface 101b of the second substrate 101 to remove a portion of the second substrate 101 and to expose the second penetration insulating layer 113. In an embodiment, after grinding or etch-back is complete, the second substrate rear surface 101b may be formed at a level lower than an end portion of the second through via 111. The grinding process may be performed to reduce a thickness of the second substrate 101. The second through via 111 may protrude from the second substrate rear surface 101b. The second protection layer 115 may be formed on the second substrate rear surface 101b. The grinding process may be performed such that the second through via 111 has a second aspect ratio of 5 or greater. For example, in the grinding process, a part or none of the second through via 111 may be ground to control the second aspect ratio.

Figure 4C:
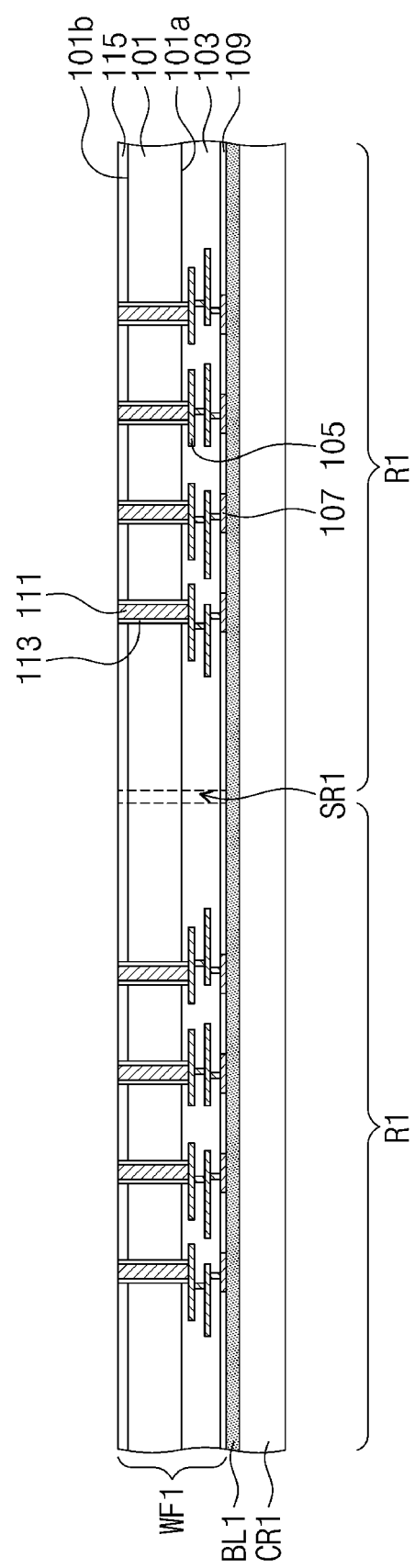

Referring to FIG. 4C, a chemical-mechanical polishing (CMP) or etch-back process may be performed to remove at least a portion of the second protection layer 115 and a portion of the second penetration insulating layer 113, and as a result, the second through vias 111 may be exposed to the outside.

Figure 4D:
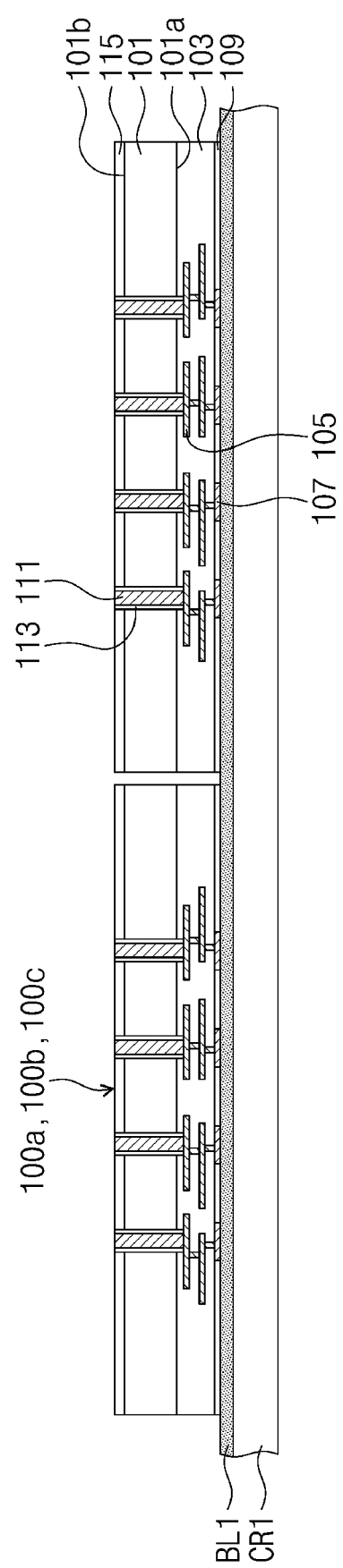

Referring to FIG. 4D, a dicing process using a laser beam or the like may be performed to remove the first separation region SR1 of the first wafer structure WF1, and as a result, a plurality of semiconductor dies 100a, 100b, and 100c may be formed. The second to fourth semiconductor dies 100a, 100b, and 100c of FIG. 1 may be formed by this process. Thereafter, the semiconductor dies 100a, 100b, and 100c may be detached from the first adhesive layer BL1.

The fifth semiconductor die 100d of FIG. 1 may be formed by performing the dicing process on the first wafer structure WF1, without the process of forming the second through via 111 and the second penetration insulating layer 113 in the first wafer structure WF1. The grinding process of thinning the second substrate 101 may be omitted for the first wafer structure WF1.

Figure 4E:
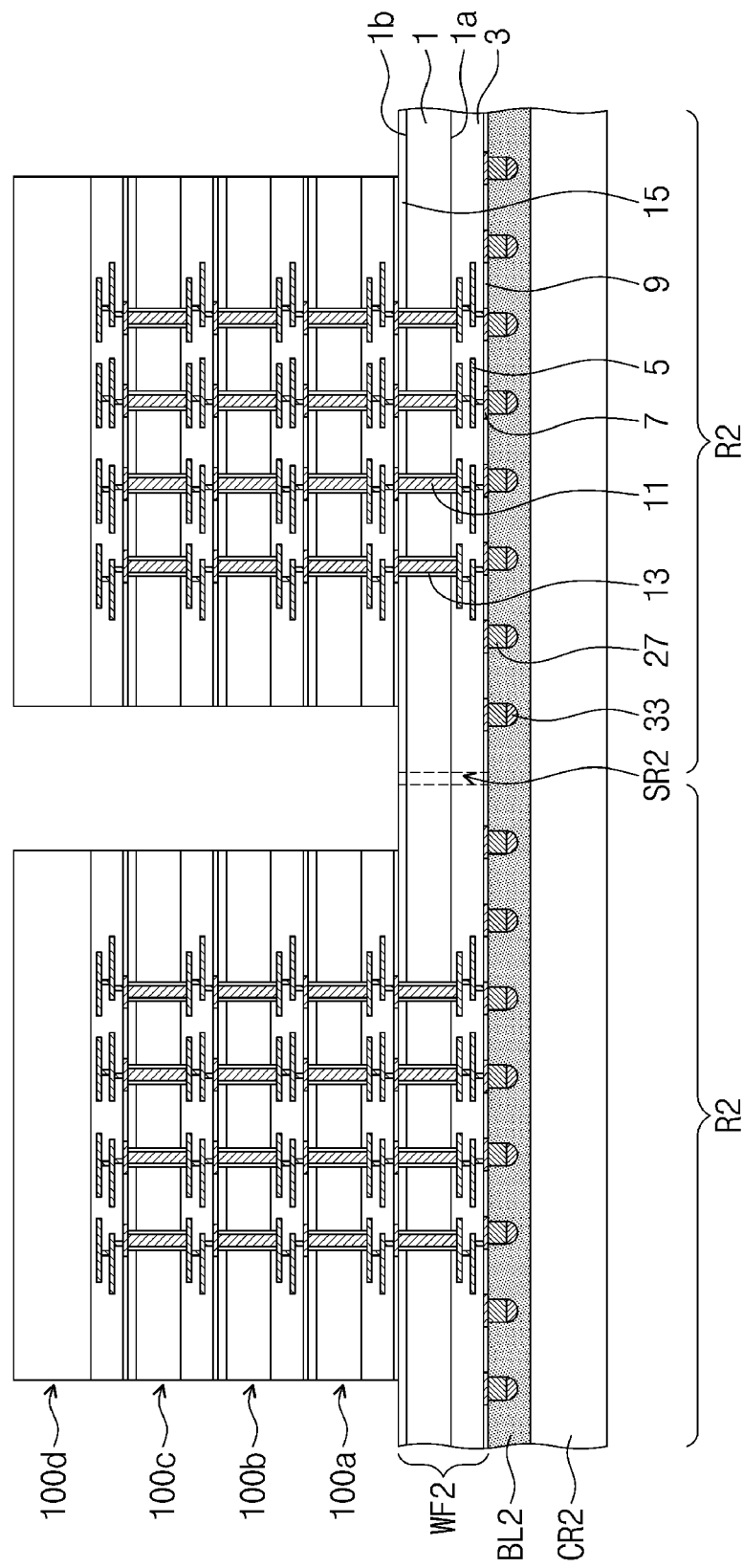

Referring to FIG. 4E, a second wafer structure WF2 may be prepared. The second wafer structure WF2 may have a plurality of second chip regions R2 and a second separation region SR2 therebetween. The second separation region SR2 may be a scribe lane region. The second wafer structure WF2 may include the first substrate 1. Each of the second chip regions R2 may include substantially the structure of the first semiconductor die 10 described with reference to FIG. 1. The first conductive bumps 27 and the solder layer 33 may be formed on the first conductive pads 7, which are provided on a bottom surface of the second wafer structure WF2. The second wafer structure WF2 may be bonded to a second carrier substrate CR2 by a second adhesive layer BL2 interposed therebetween. The second adhesive layer BL2 may be formed of or include at least one of adhesive, thermosetting, thermoplastic, or photo-curable resins.

The second to fifth semiconductor dies 100a, 100b, 100c, and 100d are stacked on the second chip region R2 of the second wafer structure WF2. In an embodiment, there may be no solder ball or conductive bump between the second to fifth semiconductor dies 100a, 100b, 100c, and 100d. Here, the second to fifth semiconductor dies 100a, 100b, 100c, and 100d may be placed such that the first and second through vias 11 and 111 are in contact with the first and second conductive pads 7 and 107 and/or the first and second through vias 11 and 111 are aligned with each other. Since the second aspect ratio of the second through vias 111 is equal to or greater than 5, the thickness (e.g., T2 in FIG. 1) of the second to fourth semiconductor dies 100a, 100b, and 100c may be increased, and in this case, a die handling operation may be easily performed on the second to fourth semiconductor dies 100a, 100b, and 100c. If the second aspect ratio is less than 5, the thickness (e.g., T2 in FIG. 1) of the second to fourth semiconductor dies 100a, 100b, and 100c may be too small to perform the die handling operation on the second to fourth semiconductor dies 100a, 100b, and 100c. In this case, a process failure may be increased.

A thermo-compression process may be performed on the structure of FIG. 4E. The thermo-compression process may be performed at a temperature of, for example, about 360° C. The thermo-compression process may cause a volume expansion of the first and second through vias 11 and 111 and the first and second conductive pads 7 and 107. Here, the aspect ratio of each of the first and second through vias 11 and 111 is equal to or greater than 5, and each of the first and second through vias 11 and 111 may have a relatively large initial volume, compared with the first and second conductive pads 7 and 107. Thus, a magnitude of the volume expansion of each of the first and second through vias 11 and 111 may be relatively greater than that of each of the first and second conductive pads 7 and 107. Accordingly, the first and second through vias 11 and 111 may be bonded to the first and second conductive pads 7 and 107 while expanding toward the first and second conductive pads 7 and 107. Here, the first and second through vias 11 and 111 may protrude outward from the first to fourth semiconductor dies 10, 100a, 100b, and 100c, as described with reference to FIG. 3. For example, either first and second conductive pads 7 and 107 may be formed to initially have an outer surface recessed compared to the first and second passivation layers 9 and 109 (as shown in FIG. 3), to which the expanding first and second through vias 11 and 111 move in to, or the end result after the thermo-compression is that the first and second conductive pads 7 and 107 are pushed up due to thermal expansion of the first and second through vias 11 and 111 to result in the void regions VD of FIG. 3.

After the thermo-compression process of bonding the second to fifth semiconductor dies 100a, 100b, 100c, and 100d, a molding process may be performed to form a mold layer (e.g., MD of FIG. 1) covering a top surface of the second wafer structure WF2 and side surfaces of the second to fifth semiconductor dies 100a, 100b, 100c, and 100d. Next, a dicing process using a laser beam or the like may be performed to remove the second wafer structure WF2 and the mold layer MD in the second separation region SR2, and as a result, a plurality of semiconductor packages (e.g., 1000 of FIG. 1) may be fabricated. Thereafter, the semiconductor packages 1000 may be separated from the second adhesive layer BL2.

In the method of fabricating a semiconductor package according to an embodiment of the inventive concept, since the first and second through vias 11 and 111 are formed to have an aspect ratio of 5 or greater, it may be possible to prevent a process failure or a bonding failure caused by technical difficulties in a die handling operation. Accordingly, reliability and production yield of the semiconductor package may be improved.

Figure 5A:
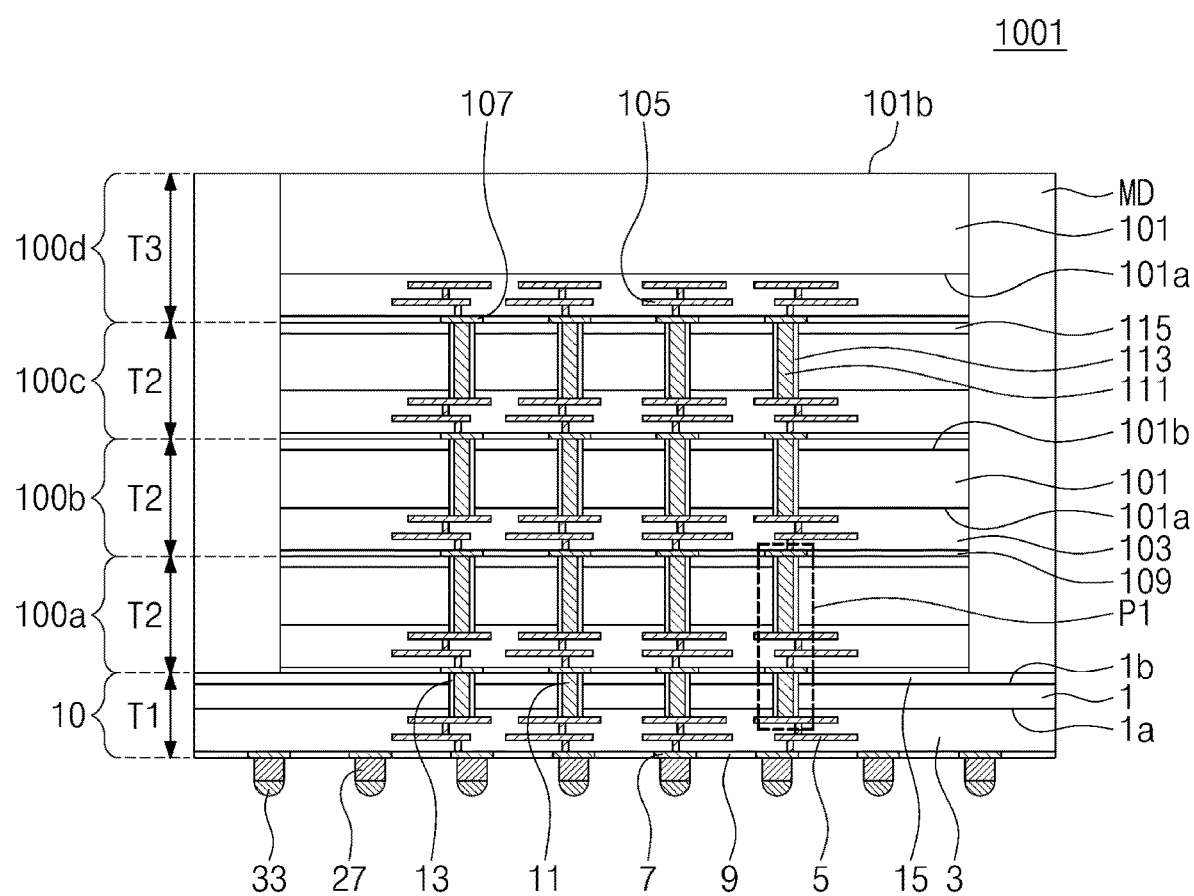
FIG. 5A is a sectional view illustrating a semiconductor package according to an embodiment of the inventive concept.
Figure 5B:
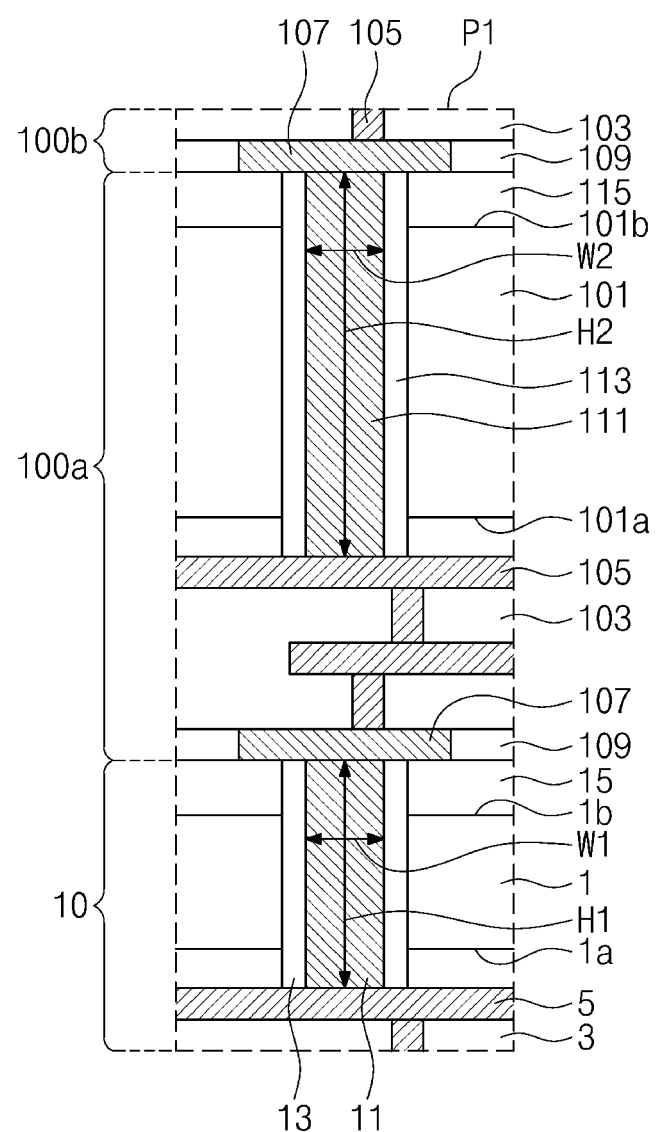
FIG. 5B is an enlarged sectional view of a portion 'P3' of FIG. 5A.

FIG. 5A is a sectional view illustrating a semiconductor package according to an embodiment of the inventive concept. FIG. 5B is an enlarged sectional view of a portion P1' of FIG. 5A.

Referring to FIGS. 5A and 5B, in a semiconductor package 1001 according to the present embodiment, the first semiconductor die 10 may have the first thickness T1. Each of the second to fourth semiconductor dies 100a, 100b, and 100c may have the second thickness T2. The fifth semiconductor die 100d may have the third thickness T3. The second thickness T2 may be larger than the first thickness T1 and may be smaller than the third thickness T3. A first aspect ratio of the first through via 11, which is given by dividing the first height H1 by the first width W1, may be less than 5. In an embodiment, the first aspect ratio may be in a range from 1 to 3. The second aspect ratio of the second through via 111 may be equal to or greater than 5. In an embodiment, the second aspect ratio may be in a range from 5 to 20. Except for the above features, the semiconductor package in the present embodiment may be substantially the same as or similar to that described with reference to FIGS. 1 to 3. The first width W1 may be equal or similar to the second width W2. The first height H1 may be smaller than the second height H2.

The fabrication process of the semiconductor package 1001 may be substantially the same as or similar to that described with reference to FIGS. 4A to 4E. Since the second wafer structure WF2, which serves as the first semiconductor die 10, is provided as the lowermost part of the semiconductor package 1001, there is no reason to dice only the second wafer structure WF2 and to stack it somewhere, and thus, a die handling operation is not required for the second wafer structure WF2. Accordingly, the first aspect ratio of the first through via 11 may be reduced to a value of 1 to 3, and in this case, the thickness of the first semiconductor die 10 may be reduced. Accordingly, it may be possible to reduce the total thickness of the semiconductor package 1001.

Figure 6:
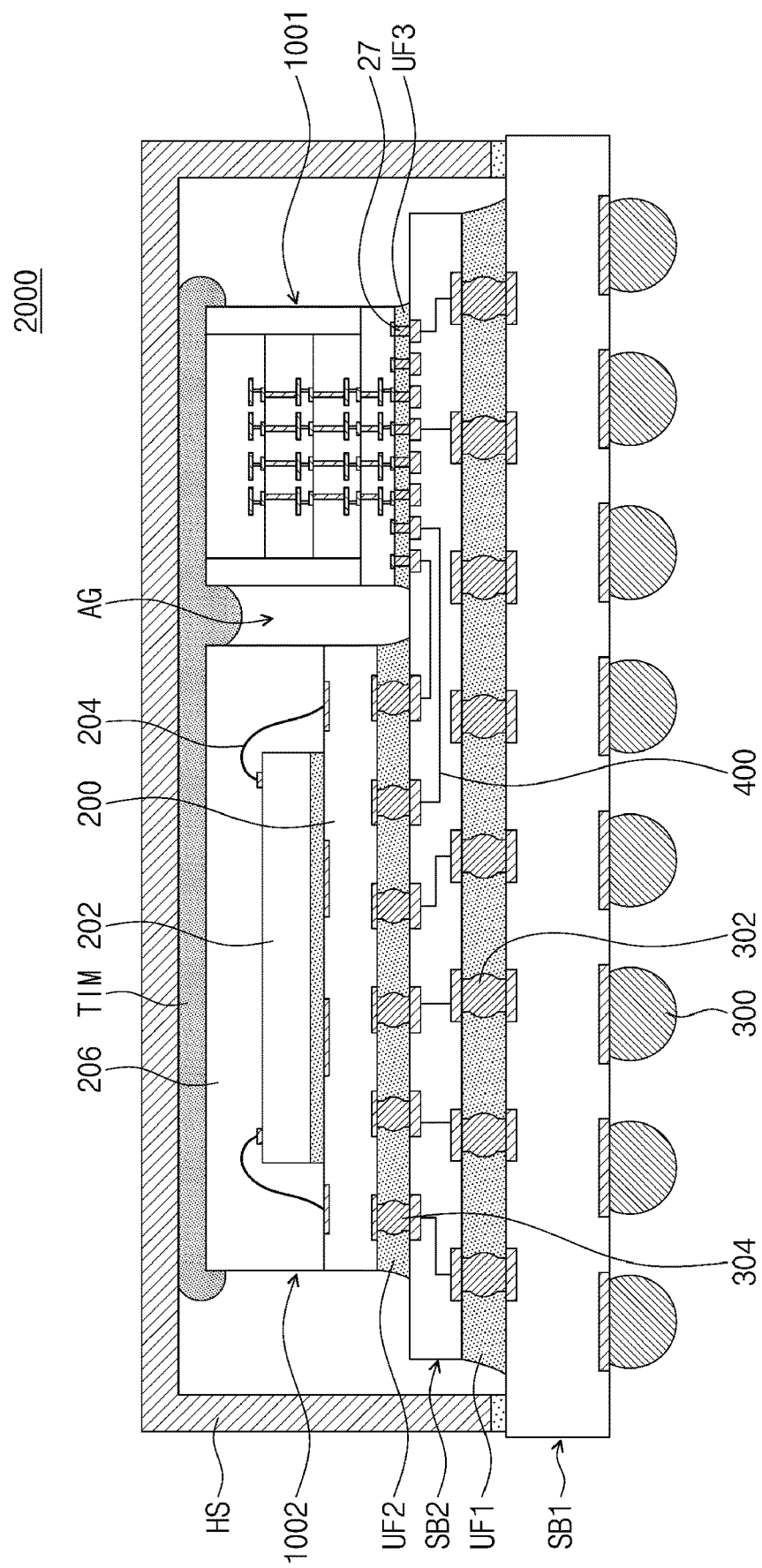
FIG. 6 is a sectional view illustrating a semiconductor package according to an embodiment of the inventive concept.

FIG. 6 is a sectional view illustrating a semiconductor package according to an embodiment of the inventive concept.

Referring to FIG. 6, a semiconductor package 2000 according to the present embodiment may include a first package substrate SB1 and a second package substrate SB2, which are sequentially stacked. A first sub-semiconductor package 1001 and a second sub-semiconductor package 1002 may be stacked on the second package substrate SB2 in a side-by-side manner. The first sub-semiconductor package 1001 and the second sub-semiconductor package 1002 may be spaced apart from each other (e.g., in a horizontal direction) to define a space, such as an air gap region AG therebetween. The term "air" as discussed herein, may refer to atmospheric air, or other gases that may be present during the manufacturing process. The first sub-semiconductor package 1001, the second sub-semiconductor package 1002, the first package substrate SB1, and the second package substrate SB2 may be covered with a heat-dissipation member HS. A thermal interface material layer TIM may be interposed between the heat-dissipation member HS and the first sub-semiconductor package 1001 and between the heat-dissipation member HS and the second sub-semiconductor package 1002. The thermal interface material layer TIM may not fill the entirety of the air gap region AG. The heat-dissipation member HS may be formed of or include at least one of materials (e.g., metals) having high thermal conductivity. The thermal interface material layer TIM may include grease or a thermosetting resin layer. The thermal interface material layer TIM may further include filler particles, which are dispersed in the thermosetting resin layer. The filler particles may be formed of or include at least one of silica, alumina, zinc oxide, or boron nitride.

The first package substrate SB1 may be, for example, a printed circuit board. The printed circuit board may include a core portion and conductive patterns disposed on opposite surfaces of the core portion. The core portion may be formed of or include at least one of thermosetting resins (e.g., epoxy resin), thermoplastic resins (e.g., polyimide), composite materials (e.g., prepreg) including the thermoplastic or thermosetting resin and a reinforcement element (e.g., glass fiber and/or inorganic filler) impregnated therein, or photocurable resins, but the inventive concept is not limited to these examples. Outer connection terminals 300 may be bonded to a bottom surface of the first package substrate SB1. The outer connection terminals 300 may include, for example, at least one of copper bumps, conductive pillars, or solder balls.

The second package substrate SB2 may be, for example, a silicon-based interposer substrate. First inner connection terminals 302 may be interposed between the first package substrate SB1 and the second package substrate SB2 to connect the first and second package substrates SB1 and SB2 to each other. A first under-fill layer UF1 may be interposed between the first package substrate SB1 and the second package substrate SB2. The first inner connection terminals 302 may be formed of or include at least one of, for example, copper bumps, conductive pillars, or solder balls.

The first sub-semiconductor package 1001 may be substantially the same as the semiconductor package 1001 described with reference to FIG. 5, or with reference to FIG. 1. The first sub-semiconductor package 1001 may be electrically connected to the second package substrate SB2 by the first conductive bumps 27. The second sub-semiconductor package 1002 may include a third package substrate 200, a sixth semiconductor die 202, which is mounted on the third package substrate 200 using a wire 204, and a second mold layer 206 covering them. Second inner connection terminals 304 may be interposed between the second package substrate SB2 and the third package substrate 200 to electrically connect the second package substrate SB2 to the third package substrate 200. A second under-fill layer UF2 may be interposed between the second package substrate SB2 and the third package substrate 200. A third under-fill layer UF3 may be interposed between the first sub-semiconductor package 1001 and the second package substrate SB2. Inner lines 400 may be disposed in the second package substrate SB2. Some of the inner lines 400 may be used to electrically connect the first sub-semiconductor package 1001 to the second sub-semiconductor package 1002. The second inner connection terminals 304 may be formed of or include at least one of, for example, copper bumps, conductive pillars, or solder balls.

Figure 7:
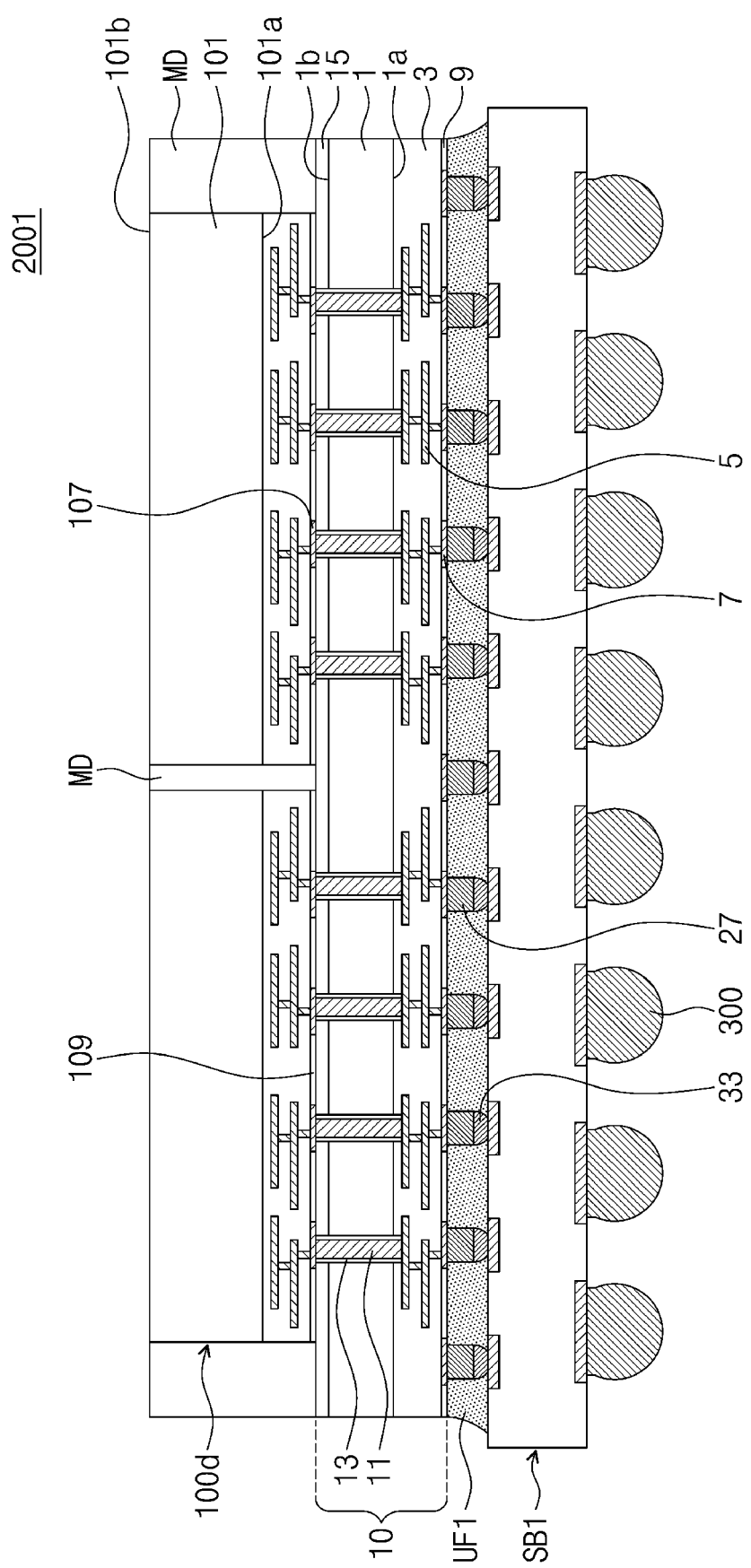
FIG. 7 is a sectional view illustrating a semiconductor package according to an embodiment of the inventive concept.

FIG. 7 is a sectional view illustrating a semiconductor package according to an embodiment of the inventive concept.

Referring to FIG. 7, in a semiconductor package 2001 according to the present embodiment, the first semiconductor die 10 may be mounted on the first package substrate SB1, and a plurality of fifth semiconductor dies 100*d* may be mounted on the first semiconductor die 10 in a side-by-side manner. The first package substrate SB1 may be, for example, a printed circuit board. The outer connection terminals 300 may be bonded to the bottom surface of the first package substrate SB1. The first semiconductor die 10 may be bonded to the first package substrate SB1 by the first conductive bumps 27 and the solder layers 33. The first under-fill layer UF1 may be interposed between the first semiconductor die 10 and the first package substrate SB1. The first semiconductor die 10 may be substantially the same or similar to the first semiconductor die of FIG. 1 (other than a size and number of terminals, for example), and the fifth semiconductor dies 100*d* may be substantially the same as or similar to the fifth semiconductor die 100*d* described with reference to FIG. 1. A space between the fifth semiconductor dies 100*d* may be filled with the mold layer MD. The side surfaces of the fifth semiconductor dies 100*d* and the top surface of the first semiconductor die 10 may be covered with the mold layer MD. The first through via 11 of the first semiconductor die 10 may contact the second conductive pad 107 of the fifth semiconductor die 100*d*. Except for the above features, the semiconductor package in the present embodiment may be substantially the same as or similar to those described with reference to FIGS. 1 to 3.

Figure 8A:
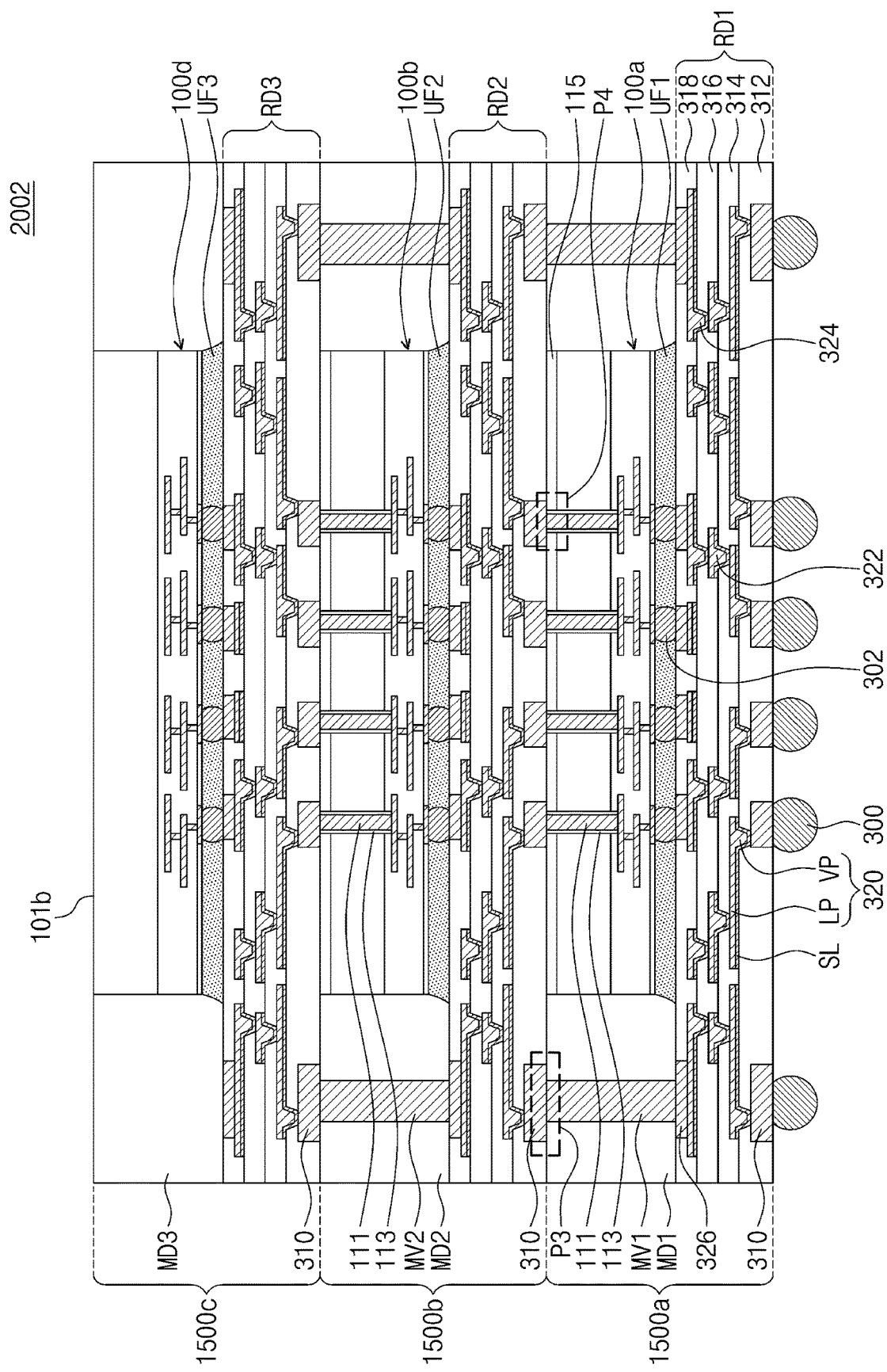
FIG. 8A is a sectional view illustrating a semiconductor package according to an embodiment of the inventive concept.
Figure 8B:
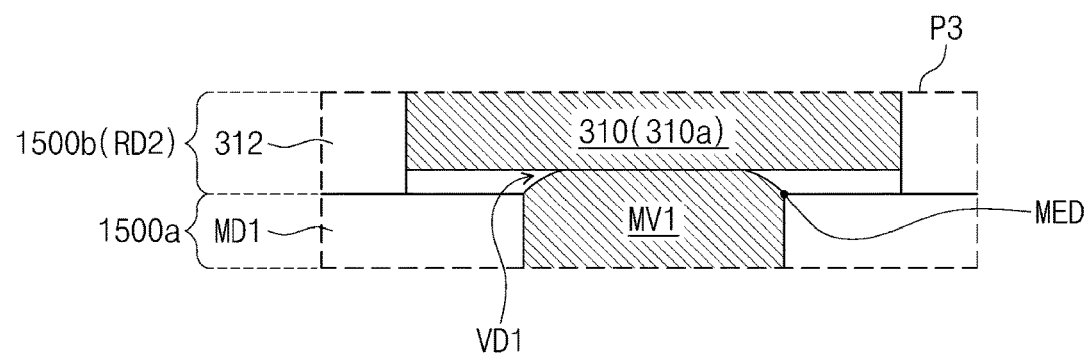
FIG. 8B is an enlarged sectional view of a portion 'P3' of FIG. 8A.
Figure 8C:
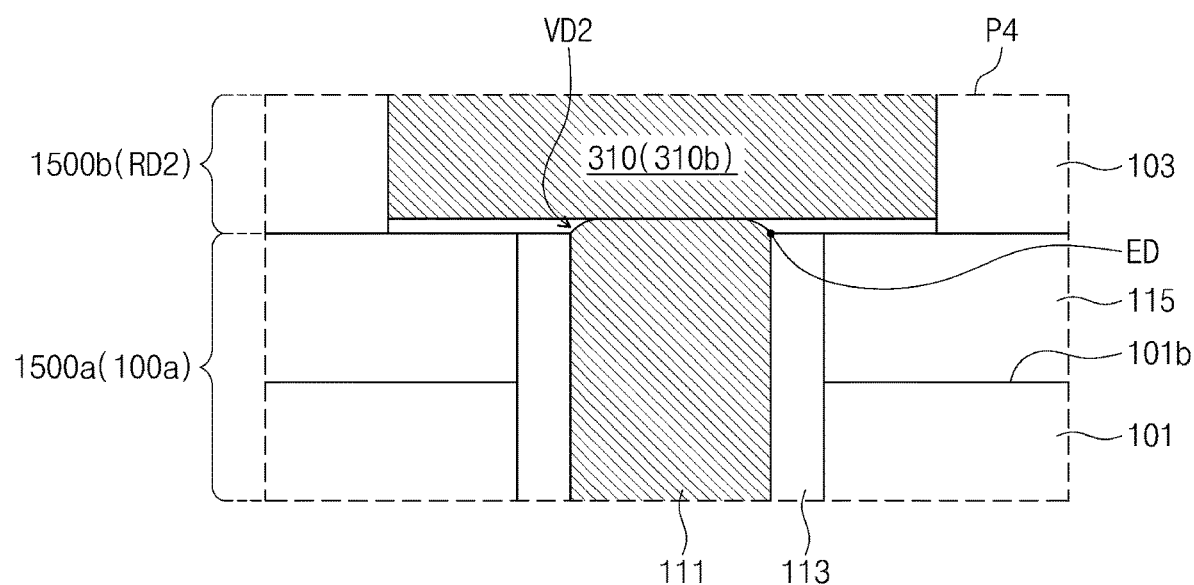
FIG. 8C is an enlarged sectional view of a portion 'P4' of FIG. 8A.

FIG. 8A is a sectional view illustrating a semiconductor package according to an embodiment of the inventive concept. FIG. 8B is an enlarged sectional view of a portion 'P3' of FIG. 8A. FIG. 8C is an enlarged sectional view of a portion 'P4' of FIG. 8A.

Referring to FIG. 8A, a semiconductor package 2002 according to the present embodiment may include first to third sub-semiconductor packages 1500*a*, 1500*b*, and 1500*c*, which are sequentially stacked. Each of the first to third sub-semiconductor packages 1500*a*, 1500*b*, and 1500*c* may have a chip-last type fan-out wafer-level package (FOWLP) shape. The first to third sub-semiconductor packages 1500*a*, 1500*b*, and 1500*c* may include redistribution structures RD1, RD2, and RD3 and semiconductor dies 100*a*, 100*b*, and 100*d* disposed thereon, respectively. The redistribution structures RD1, RD2, and RD3 may have widths, which are larger than the semiconductor dies 100*a*, 100*b*, and 100*d*, and may protrude laterally from the semiconductor dies 100*a*, 100*b*, and 100*d*.

In detail, the first sub-semiconductor package 1500*a* may include a first redistribution structure RD1 and the second semiconductor die 100*a*. The second semiconductor die 100*a* may be substantially the same as or similar to that described with reference to FIG. 1. The second semiconductor die 100*a* may be connected to the first redistribution structure RD1 by the first inner connection terminal 302. The first under-fill layer UF1 may be interposed between the first redistribution structure RD1 and the second semiconductor die 100*a*.

The first redistribution structure RD1 may include first to fourth redistribution insulating layers 312, 314, 316, and 318, which are sequentially stacked. A first redistribution pad 310 may be provided in the first redistribution insulating layer 312. First to third redistribution patterns 320, 322, and 324 may be disposed between the first to fourth redistribution insulating layers 312, 314, 316, and 318. Each or at least one of the first to fourth redistribution insulating layers 312, 314, 316, and 318 may include at least one of a silicon oxide layer, a silicon nitride layer, or a photo imagable polyimide layer. The first to third redistribution patterns 320, 322, and 324 may be formed of or include at least one of conductive materials (e.g., metallic materials). Each of the first to third redistribution patterns 320, 322, and 324 may include a via portion VP and a line portion LP, which are connected to each other to form a unified structure. The via portion VP may be disposed below the line portion LP.

A seed/barrier pattern SL may be interposed between the first redistribution pattern 320 and the first redistribution insulating layer 312, between the second redistribution pattern 322 and the second redistribution insulating layer 314, and between the third redistribution pattern 324 and the third redistribution insulating layer 316. A redistribution pad 326 may be disposed in the fourth redistribution insulating layer 318. The outer connection terminals 300 may be bonded to the first redistribution pad 310 of the first redistribution structure RD1. A side surface of the second semiconductor die 100a and a top surface of the first redistribution structure RD1 may be covered with a first mold layer MD1. A first mold via MV1 may pass through the first mold layer MD1 and may contact the redistribution pad 326 of the first redistribution structure RD1. The first mold via MV1 may protrude outward from the first mold layer MD1.

The second sub-semiconductor package 1500b may include a second redistribution structure RD2 and the third semiconductor die 100b. The third semiconductor die 100b may be substantially the same as or similar to that described with reference to FIG. 1. The second redistribution structure RD2 may have the same structure as the first redistribution structure RD1. A side surface of the third semiconductor die 100b and a top surface of the second redistribution structure RD2 may be covered with a second mold layer MD2. A second mold via MV2 may pass through the second mold layer MD2 and may contact the redistribution pad 326 of the second redistribution structure RD2.

The third sub-semiconductor package 1500c may include a third redistribution structure RD3 and the fifth semiconductor die 100d. The fifth semiconductor die 100d may be substantially the same as or similar to that described with reference to FIG. 1. The third redistribution structure RD3 may have the same structure as the first redistribution structure RD1. A side surface of the fifth semiconductor die 100d and a top surface of the third redistribution structure RD3 may be covered with a third mold layer MD3. The third sub-semiconductor package 1500c may not include any mold via.

A thickness (e.g., in a vertical direction) of each of the redistribution pads 310 may be greater than a thickness of each of the redistribution pads 326. Redistribution pads 310 may be described as external-package redistribution pads (since they connect at an external surface of each sub-semiconductor package from one sub-semiconductor package to another device, and redistribution pads 326 may be referred to as internal-package redistribution pads (since they connect within a sub-semiconductor package). Each of the first and second mold vias MV1 and MV2 may have an aspect ratio of 5 or greater.

Referring to FIG. 8B, the first mold via MV1 may electrically connect one of the redistribution pads 326 of the first redistribution structure RD1 to one 310a of the redistribution pads 310 of the second redistribution structure RD2. The first mold via MV1 may contact the one 310a of the redistribution pads 310 of the second redistribution structure RD2. The top surface of the first mold via MV1 may be coplanar with the top surface of the first mold layer MD1, as shown in FIG. 8A. Alternatively, the top surface of the first mold via MV1 may have a rounded shape, as shown in FIG. 8B. The first mold via MV1 may protrude outward from the first sub-semiconductor package 1500a and/or the first mold layer MD1. An end portion MED of the first mold via MV1 may be spaced apart from the redistribution pad 310a, and in this case, a first void region VD1 may be provided therebetween.

Referring to FIG. 8C, the second through via 111 of the second semiconductor die 100a may contact another one 310b of the redistribution pads 310 of the second redistribution structure RD2. The upper shape of the second through via 111 may be substantially the same as or similar to that described with reference to FIG. 3. The upper edge ED of the second through via 111 may be spaced apart from the redistribution pad 310b, and in this case, a second void region VD2 may be provided between the second through via 111 and the redistribution pad 310b. A top portion of the second through via 111 may protrude outward from the second and third semiconductor dies 100a and 100b, as shown in FIG. 3. The redistribution pad 310 (and 310a and 310b) may be formed, for example, of a conductive material such as a metal, and may have a flat bottom surface in some embodiments.

The second mold via MV2 may electrically connect one of the redistribution pads 326 of the second redistribution structure RD2 to one of the redistribution pads 310 of the third redistribution structure RD3. The second mold via MV2 may contact one of the redistribution pads 310 of the third redistribution structure RD3. The second through via 111 of the third semiconductor die 100b may contact another one of the redistribution pads 310 of the third redistribution structure RD3.

The second protection layers 115 of the second and third semiconductor dies 100a and 100b may contact the first redistribution insulating layers 312 of the second and third redistribution structures RD2 and RD3. The second penetration insulating layer 113 of the second and third semiconductor dies 100a and 100b may contact the first redistribution insulating layers 312 of the second and third redistribution structures RD2 and RD3. Except for the above features, the semiconductor package in the present embodiment may be substantially the same as or similar to described with reference to FIGS. 1 to 3.

Figure 9:
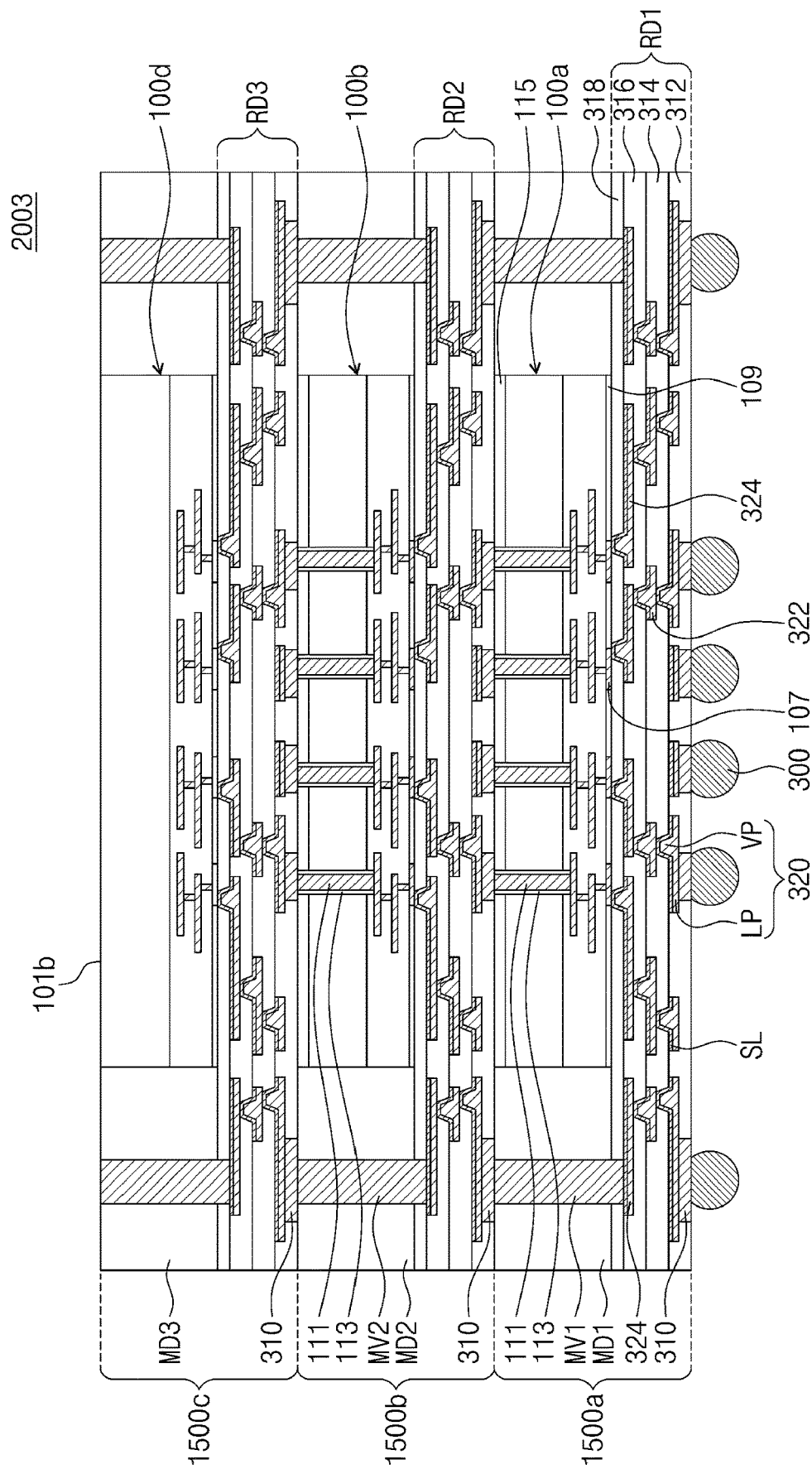
FIG. 9 is a sectional view illustrating a semiconductor package according to an embodiment of the inventive concept.

FIG. 9 is a sectional view illustrating a semiconductor package according to an embodiment of the inventive concept.

Referring to FIG. 9, a semiconductor package 2003 according to the present embodiment may include first to third sub-semiconductor packages 1500a, 1500b, and 1500c sequentially stacked. Each of the first to third sub-semiconductor packages 1500a, 1500b, and 1500c may have a chip-first type fan-out wafer-level package (FOWLP) shape. The first to third sub-semiconductor packages 1500a, 1500b, and 1500c may include redistribution structures RD1, RD2, and RD3 and semiconductor dies 100a, 100b, and 100d disposed thereon, respectively. The redistribution structures RD1, RD2, and RD3 may have widths, which are larger than the semiconductor dies 100a, 100b, and 100d, and may protrude laterally from the semiconductor dies 100a, 100b, and 100d.

In detail, the first sub-semiconductor package 1500a may include a first redistribution structure RD1 and a second semiconductor die 100a. The second semiconductor die 100a may be substantially the same as or similar to that described with reference to FIG. 1. The first redistribution structure RD1 may not include the redistribution pad 326 of FIG. 8A. Each of the first to third redistribution patterns 320, 322, and 324 may include the via portion VP and the line portion LP, which are connected to each other to form a unified structure. The via portion VP may be located on the line portion LP. The seed/barrier pattern SL may be interposed between the first redistribution pattern 320 and the second redistribution insulating layer 314, between the second redistribution pattern 322 and the third redistribution insulating layer 316, and between the third redistribution pattern 324 and the fourth redistribution insulating layer 318. The second semiconductor die 100a may contact the first redistribution structure RD1. For example, the second passivation layer 109 of the second semiconductor die 100a may contact the fourth redistribution insulating layer 318. The first mold via MV1 may pass through the fourth redistribution insulating layer 318 of the first redistribution structure RD1 and may contact the seed/barrier pattern SL on the third redistribution pattern 324.

The second sub-semiconductor package 1500b may include a second redistribution structure RD2 and a third semiconductor die 100b, which contact each other. The third semiconductor die 100b may be substantially the same as or similar to that described with reference to FIG. 1. The second redistribution structure RD2 may have the same structure as the first redistribution structure RD1. The second mold via MV2 may pass through the fourth redistribution insulating layer 318 of the second redistribution structure RD2 and may contact the seed/barrier pattern SL on the third redistribution pattern 324.

The third sub-semiconductor package 1500c may include a third redistribution structure RD3 and a fifth semiconductor die 100d, which contact each other. The fifth semiconductor die 100d may be substantially the same as or similar to that described with reference to FIG. 1. The third redistribution structure RD3 may have the same structure as the first redistribution structure RD1. Except for the above features, the semiconductor package in the present embodiment may be substantially the same as or similar to that described with reference to FIG. 8A.

Figure 10:
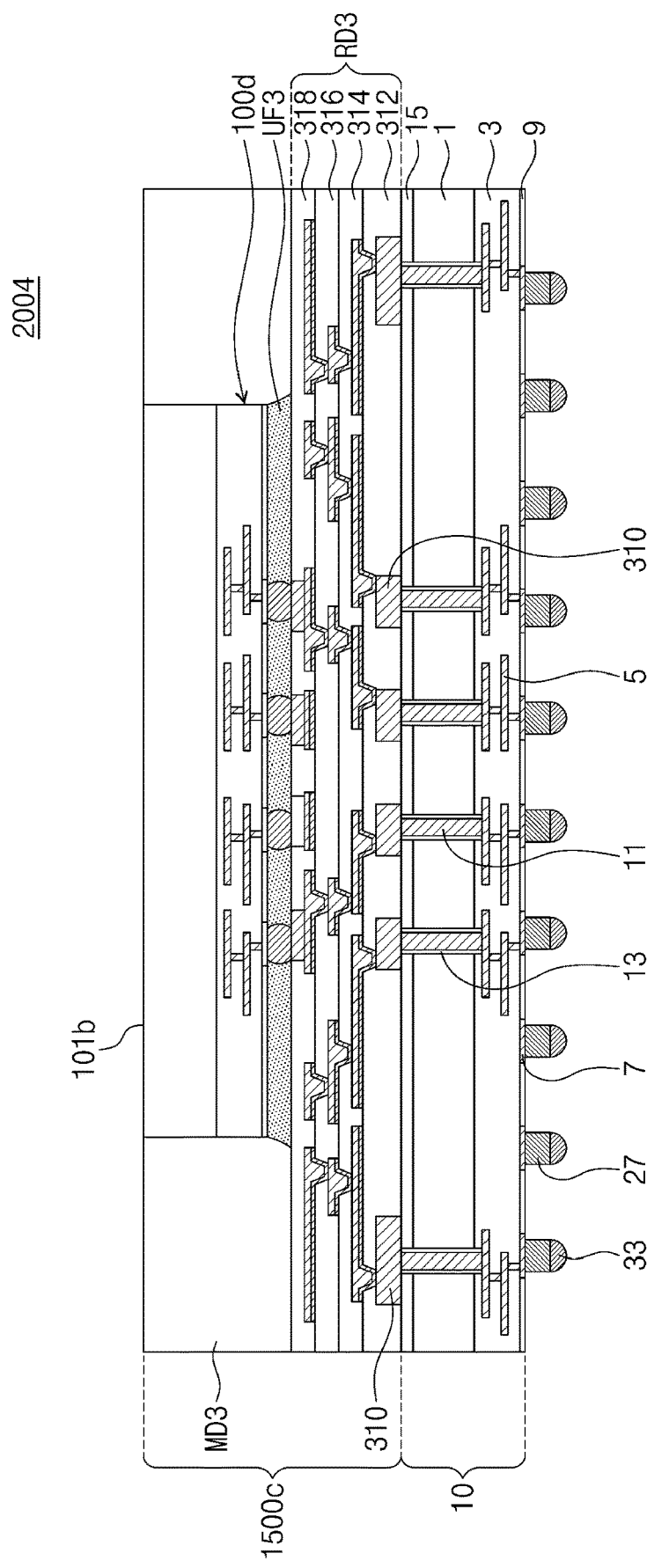
FIG. 10 is a sectional view illustrating a semiconductor package according to an embodiment of the inventive concept.

FIG. 10 is a sectional view illustrating a semiconductor package according to an embodiment of the inventive concept.

Referring to FIG. 10, a semiconductor package 2004 according to the present embodiment may have a structure, in which the third sub-semiconductor package 1500c of FIG. 8A is stacked on the first semiconductor die 10 of FIG. 7. The first semiconductor die 10 may contact the third sub-semiconductor package 1500c. The first through via 11 and the first penetration insulating layer 13 of the first semiconductor die 10 may contact the redistribution pad 310 of the third redistribution structure RD3. The first protection layer 15 of the first semiconductor die 10 may contact the first redistribution insulating layer 312 of the third redistribution structure RD3. Except for the above features, the semiconductor package in the present embodiment may be substantially the same as or similar to those described with reference to FIGS. 1 to 3 and 8A.

Figure 11:
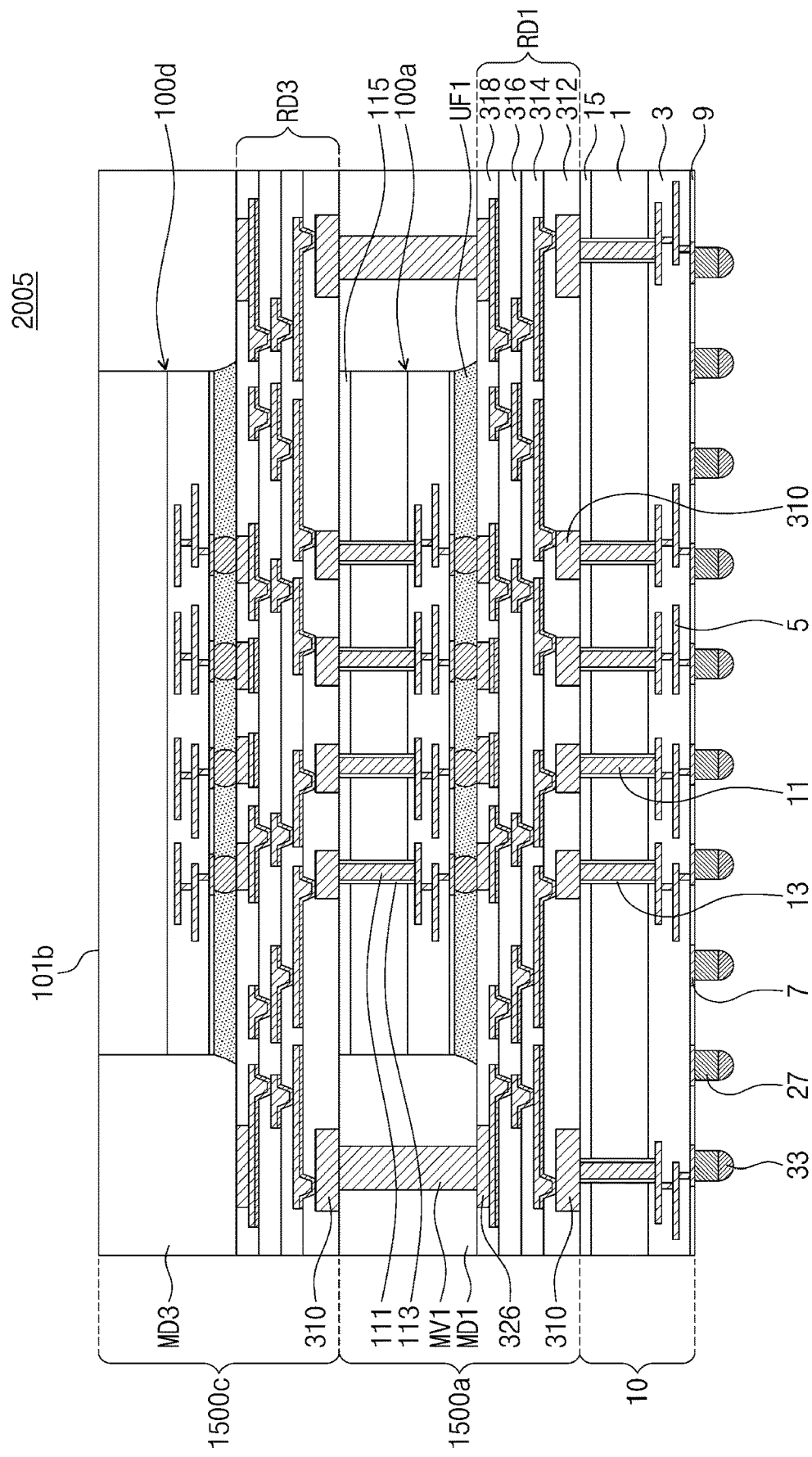
FIG. 11 is a sectional view illustrating a semiconductor package according to an embodiment of the inventive concept.

FIG. 11 is a sectional view illustrating a semiconductor package according to an embodiment of the inventive concept.

Referring to FIG. 11, a semiconductor package 2005 according to the present embodiment may have a structure, in which the first sub-semiconductor package 1500a of FIG. 8A is interposed between the first semiconductor die 10 and the third sub-semiconductor package 1500c of FIG. 10. The first semiconductor die 10, the first sub-semiconductor package 1500a, and the third sub-semiconductor package 1500c may be substantially the same as or similar to those described with reference to FIGS. 1 to 3 and FIG. 8A.

Figure 12:
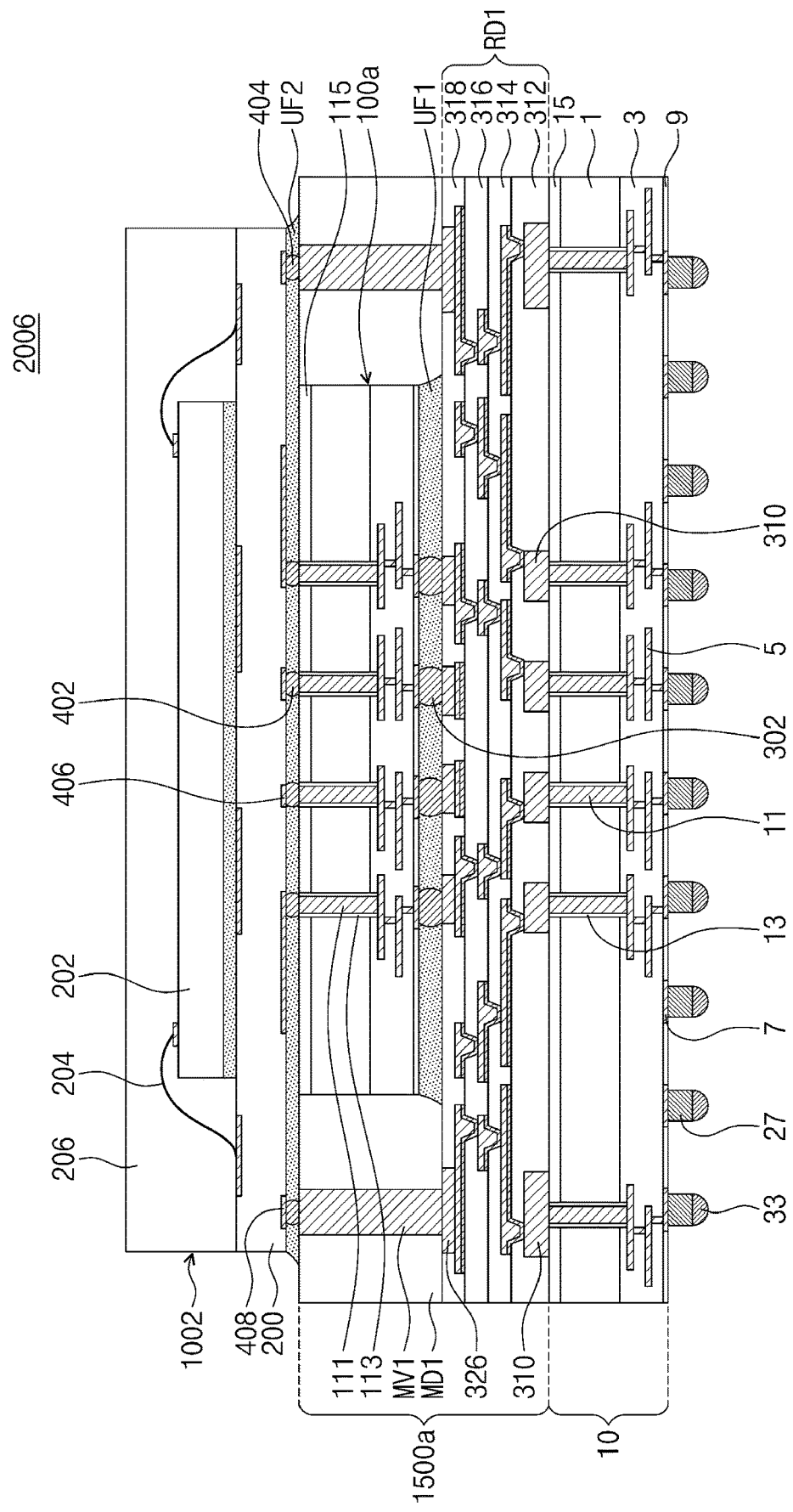
FIG. 12 is a sectional view illustrating a semiconductor package according to an embodiment of the inventive concept.

FIG. 12 is a sectional view illustrating a semiconductor package according to an embodiment of the inventive concept.

Referring to FIG. 12, a semiconductor package 2006 according to the present embodiment may have a structure, in which the third sub-semiconductor package 1500c of FIG. 11 is replaced with the second sub-semiconductor package 1002 of FIG. 6. In the first sub-semiconductor package 1500a, the second semiconductor die 100a may be connected to the first redistribution structure RD1 by the first inner connection terminal 302. First package pads 406 and second package pads 408 may be disposed on a bottom surface of the third package substrate 200 of the second sub-semiconductor package 1002. The first package pads 406 may overlap the second through via 111 of the second semiconductor die 100a. The second package pads 408 may overlap the first mold via MV1 of the first sub-semiconductor package 1500a. A second inner connection terminal 402 may electrically connect the second through via 111 of the second semiconductor die 100a to the first package pad 406. A third inner connection terminal 404 may electrically connect the first mold via MV1 to the second package pad 408. The second under-fill layer UF2 may be interposed between the second sub-semiconductor package 1002 and the first sub-semiconductor package 1500a. Except for the above features, the semiconductor package in the present embodiment may be substantially the same as or similar to those described with reference to FIGS. 1 to 3, 6, and 8A.

Figure 13:
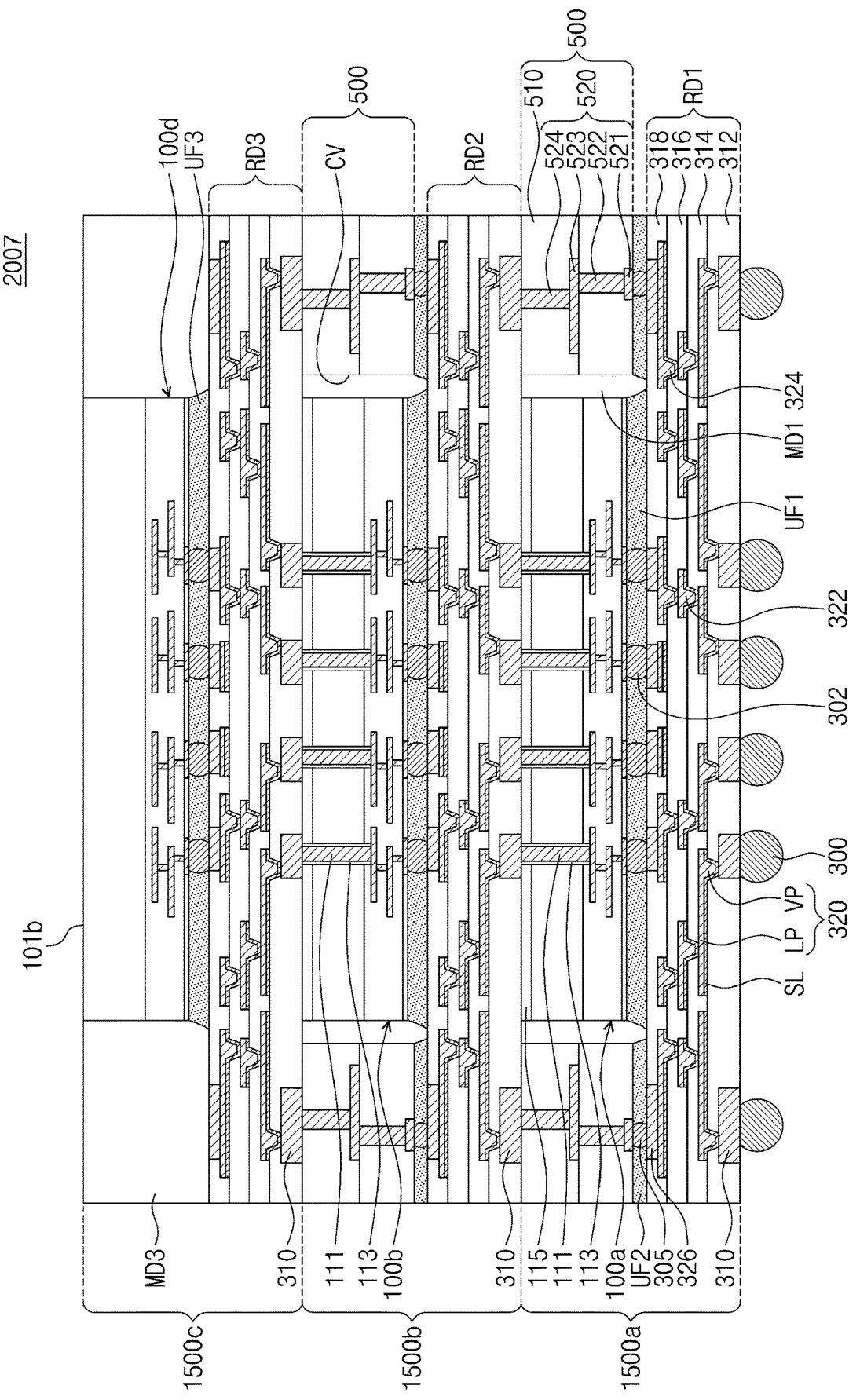
FIG. 13 is a sectional view illustrating a semiconductor package according to an embodiment of the inventive concept.

FIG. 13 is a sectional view illustrating a semiconductor package according to an embodiment of the inventive concept.

Referring to FIG. 13, a semiconductor package 2007 according to the present embodiment may include first to third sub-semiconductor packages 1500a, 1500b, and 1500c, which are sequentially stacked. The third sub-semiconductor packages 1500c may have a chip-last type fan-out wafer-level package (FOWLP) shape. Each of the first and second sub-semiconductor packages 1500a and 1500bc may have a chip-last type fan-out panel-level package (FOPLP) shape. The first to third sub-semiconductor packages 1500a, 1500b, and 1500c may include redistribution structures RD1, RD2, and RD3 and semiconductor dies 100a, 100b, and 100d disposed thereon, respectively. The redistribution structures RD1, RD2, and RD3 may have widths, which are larger than the semiconductor dies 100a, 100b, and 100d, and may protrude laterally from the semiconductor dies 100a, 100b, and 100d.

In detail, the first sub-semiconductor package 1500a may include a first redistribution structure RD1, a second semiconductor die 100a, and a connection substrate 500. The first redistribution structure RD1 and the second semiconductor die 100a may be substantially the same as those described with reference to FIG. 8A. The second semiconductor die 100a may be connected to the first redistribution structure RD1 by the first inner connection terminal 302. The first under-fill layer UF1 may be interposed between the second semiconductor die 100a and the first redistribution structure RD1.

The connection substrate 500 may include a cavity region CV provided in a center region thereof. The second semiconductor die 100a may be disposed in the cavity region CV. The connection substrate 500 may include a plurality of base layers 510 and a conductive structure 520. The base layers 510 may be formed of or include an insulating material. For example, the base layers 510 may be formed of or include at least one of carbon-based materials, ceramics, or polymers. The conductive structure 520 may include a connection pad 521, a first connection via 522, a connection line 523, and a second connection via 524. The connection substrate 500 may be connected to the first redistribution structure RD1 by a second inner connection terminal 305. The second under-fill layer UF2 may be interposed between the connection substrate 500 and the first redistribution structure RD1. A space between an inner side surface of the cavity region CV of the connection substrate 500 and the second semiconductor die 100a may be filled with the first mold layer MD1.

The second sub-semiconductor package 1500b may have the same structure as the first sub-semiconductor package 1500a. The third sub-semiconductor package 1500c may be substantially the same as that described with reference to FIG. 8A. In the present embodiment, the second connection via 524 of the first sub-semiconductor package 1500a may contact the redistribution pad 310 of the second redistribution structure RD2. The second connection via 524 may have an aspect ratio of 5 or greater. Except for the above features, the semiconductor package in the present embodiment may be substantially the same as or similar to that described with reference to FIG. 8A.

Figure 14:
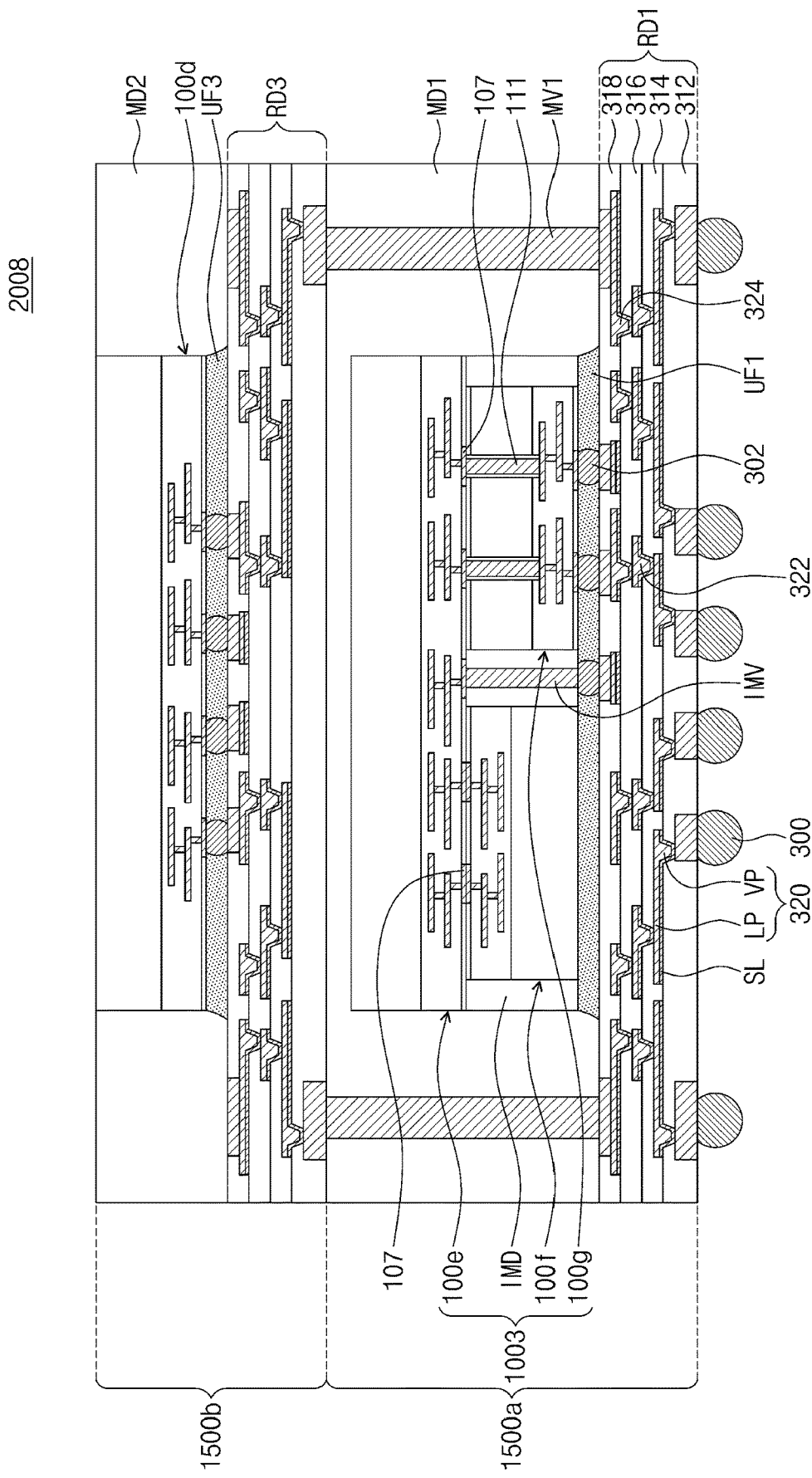
FIG. 14 is a sectional view illustrating a semiconductor package according to an embodiment of the inventive concept.

FIG. 14 is a sectional view illustrating a semiconductor package according to an embodiment of the inventive concept.

Referring to FIG. 14, a semiconductor package 2008 according to the present embodiment may include first and second sub-semiconductor packages 1500a and 1500b, which are sequentially stacked. The first sub-semiconductor package 1500a may include an inner semiconductor package 1003 disposed on the first redistribution structure RD1 and the first mold layer MD1 covering the inner semiconductor package 1003, and the first mold via MV1 penetrating the first mold layer MD1.

The inner semiconductor package 1003 may include a first inner semiconductor die 100e, a second inner semiconductor die 100f, and a third inner semiconductor die 100g. The first to third inner semiconductor dies 100e, 100f, and 100g may be logic or memory semiconductor chips of different kinds. Each of the first and second inner semiconductor dies 100e and 100f may have the same/similar structure as the fifth semiconductor die 100d of FIG. 1. The third inner semiconductor die 100g may have the same/similar structure as the first semiconductor die 10 or the second semiconductor die 100a of FIG. 1. The first inner semiconductor die 100e may have a width, which is larger than a sum of widths of the second and third inner semiconductor dies 100f and 100g. The second and third inner semiconductor dies 100f and 100g may be bonded to a bottom surface of the first inner semiconductor die 100e. The second conductive pads 107 of the second inner semiconductor die 100f may contact some of the second conductive pads 107 of the first inner semiconductor die 100e. The through via 111 of the third inner semiconductor die 100g may contact some of the second conductive pads 107 of the first inner semiconductor die 100e. Side surfaces of the second and third inner semiconductor dies 100f and 100g may be covered with an inner mold layer IMD. An inner mold via IMV may be provided between the second and third inner semiconductor dies 100f and 100g to penetrate the inner mold layer IMD. The inner mold via IMV may connect one of the second conductive pads 107 of the first inner semiconductor die 100e to the redistribution pad 326 of the first redistribution structure RD1.

The second sub-semiconductor package 1500b may include the fifth semiconductor die 100d disposed on the second redistribution structure RD2 and the second mold layer MD2 covering a side surface of the fifth semiconductor die 100d. Except for the above features, the semiconductor package in the present embodiment may be substantially the same as or similar to those described with reference to FIGS. 1 to 13.

In a semiconductor package according to an embodiment of the inventive concept, through vias of a lower semiconductor die contact conductive pads of an upper semiconductor die, without an additional conductive bump interposed therebetween, and this structure of the semiconductor package is advantageous for a fine-pitch process and for improving integration and heat-dissipation characteristics of the package. In addition, it is unnecessary to form the additional conductive bump between the upper semiconductor die and the lower semiconductor die, and thus, the fabrication process can be simplified.

Since the through vias have an aspect ratio of 5 or greater, a die-handling operation of semiconductor die can be easily performed during the fabrication process, and in particular, a die-bonding process can be effectively performed. Accordingly, it is possible to fabricate a semiconductor package with improved reliability.

While example embodiments of the inventive concept have been particularly shown and described, it will be understood by one of ordinary skill in the art that variations in form and detail may be made therein without departing from the spirit and scope of the attached claims. The embodiments described with reference to FIGS. 1 to 13 may be combined to realize the inventive concept. In the present application, the term 'semiconductor die' may be referred to as a 'semiconductor chip', and the terms 'void region' and 'air gap region' may be referred to as an 'empty space' or 'gap region'.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

We claim:

1. A semiconductor package, comprising: a first semiconductor die; a second semiconductor die stacked on the first semiconductor die, the second semiconductor die having a width smaller than a width of the first semiconductor die; a third semiconductor die stacked on the second semiconductor die, the third semiconductor die having a width smaller than the width of the first semiconductor die; and a mold layer covering side surfaces of the second and third semiconductor dies and a top surface of the first semiconductor die, wherein the second semiconductor die includes a first through via, wherein the first through via has a first aspect ratio; the first semiconductor die comprises a second through via having a second aspect ratio; and
the first aspect ratio is greater than the second aspect ratio, wherein the first aspect ratio is equal to or greater than 5, and the second aspect ratio is in a range from 1 to 3; and
the third semiconductor die comprises a first conductive pad contacting the first through via.

2. The semiconductor package of claim 1, wherein the first through via has a first width and a first height, and
a value given by dividing the first height by the first width is equal to or greater than 5.

3. The semiconductor package of claim 1, wherein the first through via protrudes outward from the second semiconductor die.

4. The semiconductor package of claim 3, wherein an edge of the first through via and the first conductive pad are spaced apart from each other to define a void region vertically therebetween.

5. The semiconductor package of claim 1, wherein the third semiconductor die does not have any through vias.

6. The semiconductor package of claim 1, wherein the first semiconductor die has a first thickness,
the second semiconductor die has a second thickness,
the third semiconductor die has a third thickness, and
the second thickness is larger than the first thickness and is smaller than the third thickness.

7. A semiconductor package, comprising:
a first sub-semiconductor package and a second sub-semiconductor package, which are sequentially stacked, wherein:
the first sub-semiconductor package comprises a first redistribution structure, a first semiconductor die connected to the first redistribution structure, a first mold layer covering a side surface of the first semiconductor die and a top surface of the first redistribution structure, and a first mold via penetrating the first mold layer,
the second sub-semiconductor package comprises a second redistribution structure, a second semiconductor die connected to the second redistribution structure, and a second mold layer covering a side surface of the second semiconductor die and a top surface of the second redistribution structure,
the second redistribution structure comprises a first redistribution pad contacting the first mold via,
the first semiconductor die comprises a first through-substrate via, and
the second redistribution structure further comprises a second redistribution pad contacting the first through-substrate via.

8. The semiconductor package of claim 7, wherein the first through-substrate via protrudes outward from the first semiconductor die.

9. The semiconductor package of claim 7, wherein the first mold via protrudes outward from the first mold layer.

10. The semiconductor package of claim 7, wherein the first sub-semiconductor package contacts the second sub-semiconductor package.

11. The semiconductor package of claim 7, wherein:
the first sub-semiconductor package further comprises:
inner connection terminals provided between the first semiconductor die and the first redistribution structure to connect them; and
an under-fill layer filling a space between the first semiconductor die and the first redistribution structure,
the first redistribution structure comprises a first redistribution pattern, and
the first redistribution pattern comprises a via portion and a line portion on the via portion, the via and line portions being connected to each other to form a unified structure.

12. The semiconductor package of claim 7, wherein:
the first semiconductor die contacts the first redistribution structure,
the first redistribution structure comprises a first redistribution pattern, and
the first redistribution pattern comprises a line portion and a via portion on the line portion, the line and via portions being connected to each other to form a unified structure.

13. A semiconductor package, comprising:
a first semiconductor die;
a plurality of second semiconductor dies stacked on the first semiconductor die, each of the second semiconductor dies having a width smaller than a width of the first semiconductor die; and
a mold layer covering side surfaces of the second semiconductor dies and a top surface of the first semiconductor die,
wherein the first semiconductor die comprises a first substrate, a first interlayer insulating layer disposed on a front surface of the first substrate, a first interconnection line disposed in the first interlayer insulating layer, a first protection layer covering a rear surface of the first substrate, and a first through via penetrating the first protection layer and the first substrate,
each of the second semiconductor dies comprises a second substrate, a second interlayer insulating layer disposed on a front surface of the second substrate, a second passivation layer covering the second interlayer insulating layer, a second conductive pad disposed in the second passivation layer, a second interconnection line disposed in the second interlayer insulating layer, a second protection layer covering a rear surface of the second substrate, and a second through via penetrating the second protection layer and the second substrate,
the first through via contacts the second conductive pad of a lowermost one of the second semiconductor dies, and
the second through via of the lowermost one of the second semiconductor dies has an aspect ratio equal to or greater than 5.

14. The semiconductor package of claim 13, wherein the first through via has an aspect ratio in a range from 1 to 3.

15. The semiconductor package of claim 13, wherein the second through via for each second semiconductor die protrudes outward from the respective second semiconductor die.

16. The semiconductor package of claim 13, wherein the second through via has a rounded top surface.

17. The semiconductor package of claim 13, wherein an additional semiconductor die stacked on a topmost one of the second semiconductor dies does not include any through vias.

* * * * *